US012628478B2

(12) United States Patent
Lee et al.

(10) Patent No.: US 12,628,478 B2
(45) Date of Patent: May 12, 2026

(54) DISPLAY DEVICE

(71) Applicant: SAMSUNG DISPLAY CO., LTD.,
Yongin-si (KR)

(72) Inventors: Jin Woo Lee, Suwon-si (KR); Zu Seok Oh, Cheonan-si (KR); Jeong Hyun Lee, Asan-si (KR); Kyung Ah Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 526 days.

(21) Appl. No.: 17/985,661

(22) Filed: Nov. 11, 2022

(65) Prior Publication Data

US 2023/0282785 A1 Sep. 7, 2023

(30) Foreign Application Priority Data

Feb. 25, 2022 (KR) ........................ 10-2022-0025160

(51) Int. Cl.
| | |
|---|---|
| *H10H 20/852* | (2025.01) |
| *H01L 25/16* | (2023.01) |
| *H10K 50/842* | (2023.01) |
| *H10H 20/85* | (2025.01) |

(52) U.S. Cl.
CPC ......... *H10H 20/852* (2025.01); *H01L 25/167* (2013.01); *H10H 20/8506* (2025.01)

(58) Field of Classification Search
CPC .. H10H 20/852; H10H 20/851; H01L 25/167; H01L 25/0753; H10K 59/122
See application file for complete search history.

(56) References Cited

U.S. PATENT DOCUMENTS

| | | | |
|---|---|---|---|
| 10,749,142 B2 | 8/2020 | Kim | |
| 10,777,771 B2 | 9/2020 | Lee et al. | |
| 2016/0268540 A1* | 9/2016 | Kim ..................... | H10K 59/131 |
| 2018/0374909 A1* | 12/2018 | Nishikiori ............ | H10K 59/122 |
| 2019/0214587 A1* | 7/2019 | Kim ........................ | G09F 9/301 |
| 2019/0312229 A1* | 10/2019 | Kim ........................ | H10K 59/12 |
| 2020/0185647 A1* | 6/2020 | Lee ................... | H10K 59/8722 |
| 2020/0212134 A1* | 7/2020 | Lee ........................ | H10K 71/12 |

FOREIGN PATENT DOCUMENTS

| | | | |
|---|---|---|---|
| KR | 2010-0053307 A | 5/2010 |
| KR | 2013-0132657 A | 12/2013 |
| KR | 2018-0062155 A | 6/2018 |
| KR | 2019-0117860 A | 10/2019 |
| KR | 2020-0071194 A | 6/2020 |
| KR | 2021-0095774 A | 8/2021 |
| KR | 2021-0146767 A | 12/2021 |

* cited by examiner

*Primary Examiner* — Monica D Harrison
*Assistant Examiner* — Jacob T Nelson
(74) *Attorney, Agent, or Firm* — Womble Bond Dickinson (US) LLP

(57) ABSTRACT

A display device is provided. The display device includes a substrate including a display area and a non-display area, an insulating layer above the substrate, and in the display area and the non-display area, and at least one dam in the non-display area, surrounding the display area, and including a lower dam layer above the substrate, an intermediate dam layer above the lower dam layer, and an upper dam layer covering the lower dam layer and the intermediate dam layer, wherein the insulating layer is between the intermediate dam layer and the upper dam layer.

18 Claims, 23 Drawing Sheets

RME: RME1, RME2
CNE: CNE1, CNE2

DISPLAY DEVICE

CROSS-REFERENCE TO RELATED APPLICATION

This application claims priority to, and the benefit of, Korean Patent Application No. 10-2022-0025160 filed on Feb. 25, 2022 in the Korean Intellectual Property Office, the contents of which are herein incorporated by reference in their entirety.

BACKGROUND

1. Field

The present disclosure relates to a display device.

2. Description of the Related Art

The importance of display devices has steadily increased with the development of multimedia technology. In response thereto, various types of display devices, such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material, and an inorganic light emitting diode using an inorganic material as a light emitting material.

SUMMARY

Aspects of the present disclosure provide a display device capable of reducing peeling-off of a dam and reducing or preventing the likelihood of an organic material overflowing to an outer portion of a substrate during a process.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the disclosure, a display device includes a substrate including a display area and a non-display area, an insulating layer above the substrate, and in the display area and the non-display area, and at least one dam in the non-display area, surrounding the display area, and including a lower dam layer above the substrate, an intermediate dam layer above the lower dam layer, and an upper dam layer covering the lower dam layer and the intermediate dam layer, wherein the insulating layer is between the intermediate dam layer and the upper dam layer.

The insulating layer may cover the lower dam layer and the intermediate dam layer, and contacts the lower dam layer and the intermediate dam layer.

The upper dam layer may contact a top surface of the insulating layer.

The intermediate dam layer may contact a top surface of the lower dam layer, wherein a width of the lower dam layer is greater than a width of the intermediate dam layer.

2

A width of the upper dam layer may be greater than a width of the lower dam layer and may be greater than a width of the intermediate dam layer.

The display device may further include a via layer between the substrate and the insulating layer, and defining a hole portion.

The hole portion may be between the at least one dam and the display area, and may surround the display area in plan view.

The insulating layer may be above the via layer, wherein a portion of the insulating layer is in the hole portion.

The display area may include pixels including sub-pixels, the sub-pixels including a first bank pattern and a second bank pattern spaced apart from each other, a first electrode overlapping the first bank pattern, a second electrode overlapping the second bank pattern, a light emitting element above the first electrode and the second electrode, a first connection electrode contacting one end of the light emitting element, a second connection electrode contacting another end of the light emitting element, a bank layer partitioning the sub-pixels, and an upper bank layer above the bank layer.

The lower dam layer may include a same material as the first bank pattern and the second bank pattern, wherein the intermediate dam layer includes a same material as the bank layer, and wherein the upper dam layer includes a same material as the upper bank layer.

The insulating layer may cover the first electrode, the second electrode, the first bank pattern, the second bank pattern, and the bank layer, and extends to the non-display area.

According to one or more embodiments of the disclosure, a display device includes a substrate including a display area and a non-display area, a via layer above the substrate, an insulating layer above the via layer, and in the display area and the non-display area, and at least one dam in the non-display area, and surrounding the display area, wherein the insulating layer defines vent holes penetrating the insulating layer in the non-display area, and wherein the at least one dam overlaps the vent holes.

The vent holes may be spaced apart from each other to surround the display area, and expose a top surface of the via layer.

The at least one dam may cover the vent holes, wherein a width of the at least one dam is greater than a diameter of one of the vent holes.

The at least one dam may contact a top surface and a side surface of the insulating layer in which the vent holes are formed, and may contact the top surface of the via layer exposed by the vent holes.

According to one or more embodiments of the disclosure, a display device includes a substrate including a display area including sub-pixels, and a non-display area including dummy pixels, a bank layer above the substrate, and configured to partition the sub-pixels and the dummy pixels, and an upper bank layer above the bank layer, and overlapping the bank layer, wherein the dummy pixels surround the display area, and wherein the bank layer and the upper bank layer are in a grid pattern in plan view.

The bank layer and the upper bank layer may continuously extend from the display area to the non-display area.

The display device may further include at least one insulating layer between the bank layer and the upper bank layer, covering the bank layer, and continuously extending from the display area to the non-display area.

The display device may further include a color control layer above the sub-pixels, a first capping layer above the color control layer, a low refractive index layer above the first capping layer, a second capping layer above the low refractive index layer, and a planarization layer above the second capping layer, wherein the first capping layer, the low refractive index layer, the second capping layer, and the planarization layer extend from the display area to the non-display area above the dummy pixels.

The first capping layer, the second capping layer, and the planarization layer may cover the bank layer and the upper bank layer in the non-display area.

In accordance with a display device according to embodiments, an insulating layer containing an inorganic material is formed in a dam that has a multilayer structure, thereby increasing an adhesive force of the dam, and thus reducing or preventing the likelihood of the dam peeling off. Further, the dam and a vent hole of the insulating layer overlap each other, thereby further increasing the adhesive force of the dam.

Furthermore, a plurality of dummy pixels are arranged in a non-display area so that a bank layer and an upper bank layer, which partition the dummy pixels, may serve as a dam to reduce or prevent the likelihood of the organic material overflowing to the outer portion of the substrate.

However, the aspects of the present disclosure are not limited to the aforementioned aspects, and various other aspects are included in the present disclosure.

BRIEF DESCRIPTION OF THE DRAWINGS

The above and other aspects of the present disclosure will become more apparent by describing in detail embodiments thereof with reference to the attached drawings, in which:

FIG. 3 is a cross-sectional view taken along the line E1-E1' of FIG. 2;

FIG. 4 is a cross-sectional view taken along the line E2-E2' of FIG. 2;

FIG. 8 is a cross-sectional view taken along the line A1-A1' of FIG. 7;

FIG. 12 is a cross-sectional view schematically illustrating a display device according to one or more other embodiments;

FIGS. 18 to 23 are views sequentially illustrating a method of manufacturing a display device according to one or more embodiments.

DETAILED DESCRIPTION

Figure 1:
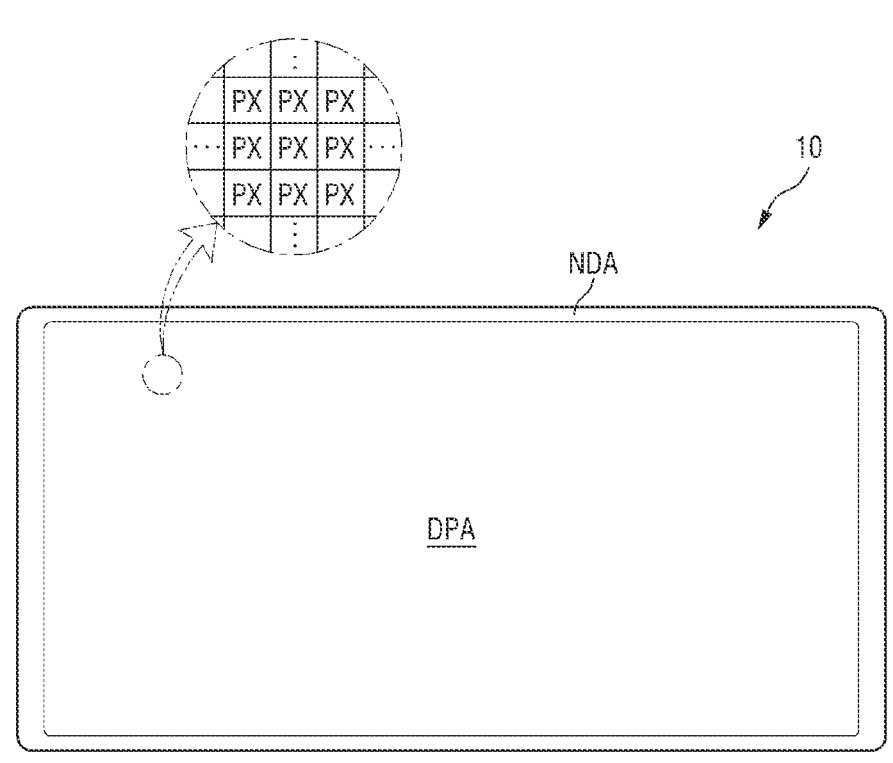
FIG. 1 is a schematic plan view of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the present disclosure is not limited thereto, and other display panels may be applied within the same scope of technical spirit.

The shape of the display device 10 may be variously modified. For example, the display device 10 may have a shape, such as a rectangular shape elongated in a horizontal direction, a rectangular shape elongated in a vertical direction, a square shape, a quadrilateral shape with rounded corners (vertices), another polygonal shape, and/or a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. The shape of each pixel PX may be a rectangular or square shape in plan view. However, the present disclosure is not limited thereto, and it may be a rhombic shape in which each side is inclined with respect to one direction. The pixels PX may be arranged in a stripe type or an island type. In addition, each of the pixels PX may include one or more light emitting elements that emit light of a corresponding wavelength band to display a corresponding color.

The non-display area NDA may be located around the display area DPA. The non-display area NDA may completely or partially surround the display area DPA. The display area DPA may have a rectangular shape, and the non-display area NDA may be located adjacent to four sides of the display area DPA. The non-display area NDA may form a bezel of the display device 10. Wires or circuit drivers included in the display device 10 may be located in the non-display area NDA, or external devices may be mounted thereon.

Figure 2:
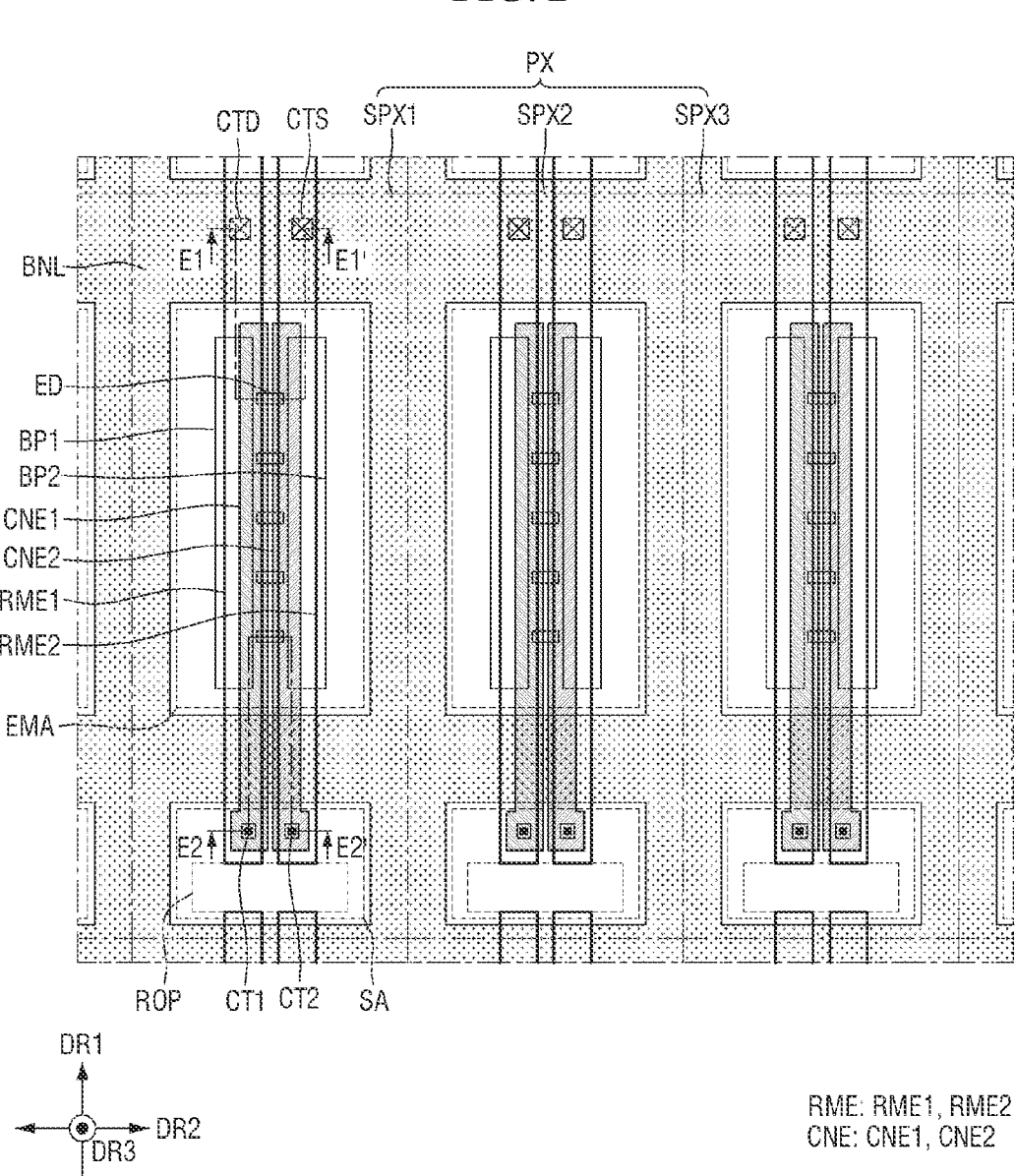
FIG. 2 is a plan view illustrating one pixel of a display device according to one or more embodiments.

FIG. 2 is a plan view illustrating one pixel of a display device according to one or more embodiments. FIG. 2 illustrates planar arrangement of electrodes RME (RME1 and RME2), bank patterns BP1 and BP2, a bank layer BNL, a plurality of light emitting elements ED (ED1 and ED2), and connection electrodes CNE (CNE1 and CNE2) located in one pixel PX of the display device 10.

Referring to FIG. 2, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be red, the second color may be green, and the third color may be blue. However, the present disclosure is not limited thereto, and the sub-pixels SPXn may emit light of the same color. In one or more embodiments, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is located to emit light of a corresponding wavelength band. The non-emission area may be a region in which the light emitting element ED is not located, and may be a region from which light is not emitted, because light emitted from the light emitting element ED does not reach the non-emission area.

The emission area EMA may include the region in which the light emitting element ED is located, and a region adjacent to the light emitting element ED in which the lights from the light emitting element ED are emitted. For example, the emission area EMA may further include a region in which the light emitted from the light emitting element ED is reflected or refracted by another member and then emitted. The plurality of light emitting elements ED may be located in each sub-pixel SPXn, and the emission area may be formed to include an area where the light emitting elements ED are located along with an area adjacent thereto.

Although it is shown in the drawing that the sub-pixels SPXn have the emission areas EMA that are substantially identical in size, the present disclosure is not limited thereto. In some embodiments, the emission areas EMA of the sub-pixels SPXn may have different respective sizes according to a color or wavelength band of light emitted from the light emitting element ED located in each sub-pixel.

Each sub-pixel SPXn may further include a sub-region SA located in the non-emission area. The sub-region SA of the corresponding sub-pixel SPXn may be located on the lower side of the emission area EMA, which is the other side in the first direction DR1. The emission area EMA and the sub-region SA may be alternately arranged along the first direction DR1, and the sub-region SA may be located between the emission areas EMA of adjacent sub-pixels SPXn spaced apart from each other in the first direction DR1. For example, the emission area EMA and the sub-region SA may be alternately arranged in the first direction DR1, and the emission areas EMA, like the sub-regions SA, may be repeatedly arranged in the second direction DR2. However, the present disclosure is not limited thereto, and the arrangement of the emission areas EMA and the sub-regions SA in the plurality of pixels PX may be different from that shown in FIG. 2.

Light may not be emitted from the sub-region SA because the light emitting element ED is not located in the sub-region SA, but an electrode RME located in each sub-pixel SPXn may be partially located in the sub-region SA. The electrodes RME located in different sub-pixels SPXn may be located to be separated at a separation portion ROP of the sub-region SA.

The display device 10 may include the plurality of electrodes RME (RME1 and RME2), the bank patterns BP1 and BP2, the bank layer BNL, the light emitting elements ED, and the connection electrodes CNE (CNE1 and CNE2).

The plurality of bank patterns BP1 and BP2 may be located in the emission area EMA of each sub-pixel SPXn. The bank patterns BP1 and BP2 may have a width (e.g., predetermined width) in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be located on the left side with respect to the center of the emission area EMA, which is one side in the second direction DR2. The second bank patterns BP2 may be located on the right side with respect to the center of the emission area EMA, which is the other side in the second direction DR2, while being spaced apart from the first bank pattern BP1. The first bank pattern BP1 and the second bank pattern BP2 may be alternately located along the second direction DR2, and may be located in an island-like pattern in the display area DPA. The plurality of light emitting elements ED may be arranged between the first bank pattern BP1 and the second bank pattern BP2.

The lengths of the first bank pattern BP1 and the second bank pattern BP2 in the first direction DR1 may be the same, and may be smaller than the length of the emission area EMA surrounded by the bank layer BNL in the first direction DR1. The first bank pattern BP1 and the second bank pattern BP2 may be spaced apart from a portion of the bank layer BNL extending in the second direction DR2. However, the present disclosure is not limited thereto, and the bank patterns BP1 and BP2 may be integrated with the bank layer BNL, or may partially overlap the portion of the bank layer BNL extending in the second direction DR2. In this case, the lengths of the bank patterns BP1 and BP2 in the first direction DR1 may be greater than or equal to the length of the emission area EMA surrounded by the bank layer BNL in the first direction DR1.

The widths of the first bank pattern BP1 and the second bank pattern BP2 in the second direction DR2 may be the same. However, the present disclosure is not limited thereto, and they may have different respective widths. For example, one bank pattern may have a larger width than the other bank pattern, and the bank pattern having a larger width may be located across the emission areas EMA of sub-pixels SPXn that are adjacent in the second direction DR2. In this case, in the bank pattern located across the plurality of emission areas EMA, a portion of the bank layer BNL extending in the first direction DR1 may overlap the second bank pattern BP2 in the thickness direction. Although it is illustrated in the drawing that two bank patterns BP1 and BP2 having the same width are arranged for each sub-pixel SPXn, the present disclosure is not limited thereto. The number and the shape of the bank patterns BP1 and BP2 may vary depending on the number or the arrangement structure of the electrodes RME.

The plurality of electrodes RME (RME1 and RME2) have a shape extending in one direction, and are included in each sub-pixel SPXn. The plurality of electrodes RME1 and RME2 may extend in the first direction DR1 to be located across the emission area EMA of the sub-pixel SPXn and the sub-region SA, and may be located to be spaced apart from each other in the second direction DR2. The plurality of electrodes RME may be electrically connected to the light emitting elements ED, as described later. However, the present disclosure is not limited thereto, and the electrodes RME might not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced apart from the first electrode RME1 in the second direction DR2. A first electrode RME1 may be located on the first bank pattern BP1, and a second electrode RME2 may be located on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that two electrodes RME have a shape extending in the first direction DR1 for each sub-pixel SPXn, the present disclosure is not limited thereto. For example, the display device 10 may have a shape in which a larger number of electrodes RME are located in one sub-pixel SPXn or the electrodes RME are partially bent and/or have different widths depending on corresponding positions.

The bank layer BNL may be located to surround the plurality of sub-pixels SPXn, the emission area EMA, and the sub-region SA. The bank layer BNL may be located at the boundary between the sub-pixels SPXn adjacent in the first direction DR1 and the second direction DR2, and may also be located at the boundary between the emission area EMA and the sub-region SA. The sub-pixels SPXn, the emission area EMA, and the sub-region SA of the display device 10 may be the areas delimited by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in plan view to be arranged in a grid pattern over the entire surface of the display area DPA. The bank layer BNL may be located along the boundaries between the sub-pixels SPXn to delimit the neighboring sub-pixels SPXn. The bank layer BNL may also be arranged to surround the emission area EMA and the sub-region SA located for each sub-pixel SPXn to delimit them from each other.

The plurality of light emitting elements ED may be arranged in the emission area EMA. The light emitting elements ED may be located between the bank patterns BP1 and BP2, and may be arranged to be spaced apart from each other in the first direction DR1. In one or more embodiments, the plurality of light emitting elements ED may have a shape extending in one direction, and ends thereof may be located on respective electrodes RME. The length of the light emitting element ED may be greater than the gap between the electrodes RME, which are spaced apart from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2, or may extend in a direction oblique to the second direction DR2.

The plurality of connection electrodes CNE (CNE1 and CNE2) may be located on the plurality of electrodes RME and the bank patterns BP1 and BP2. The plurality of connection electrodes CNE may have a shape extending in one direction, and may be located to be spaced apart from each other. Each of the connection electrodes CNE may contact the light emitting element ED, and may be electrically connected to the electrode RME or to a conductive layer thereunder.

The connection electrodes CNE may include the first connection electrode CNE1 and the second connection electrode CNE2 located in each sub-pixel SPXn. The first connection electrode CNE1 may have a shape extending in the first direction DR1 and may be located on the first electrode RME1 or the first bank pattern BP1. The first connection electrode CNE1 may partially overlap the first electrode RME1, and may be located across the emission area EMA and the sub-region SA over the bank layer BNL. The second connection electrode CNE2 may have a shape extending in the first direction DR1, and may be located on the second electrode RME2 or the second bank pattern BP2. The second connection electrode CNE2 may partially overlap the second electrode RME2, and may be located across the emission area EMA and the sub-region SA over the bank layer BNL.

Figure 3:
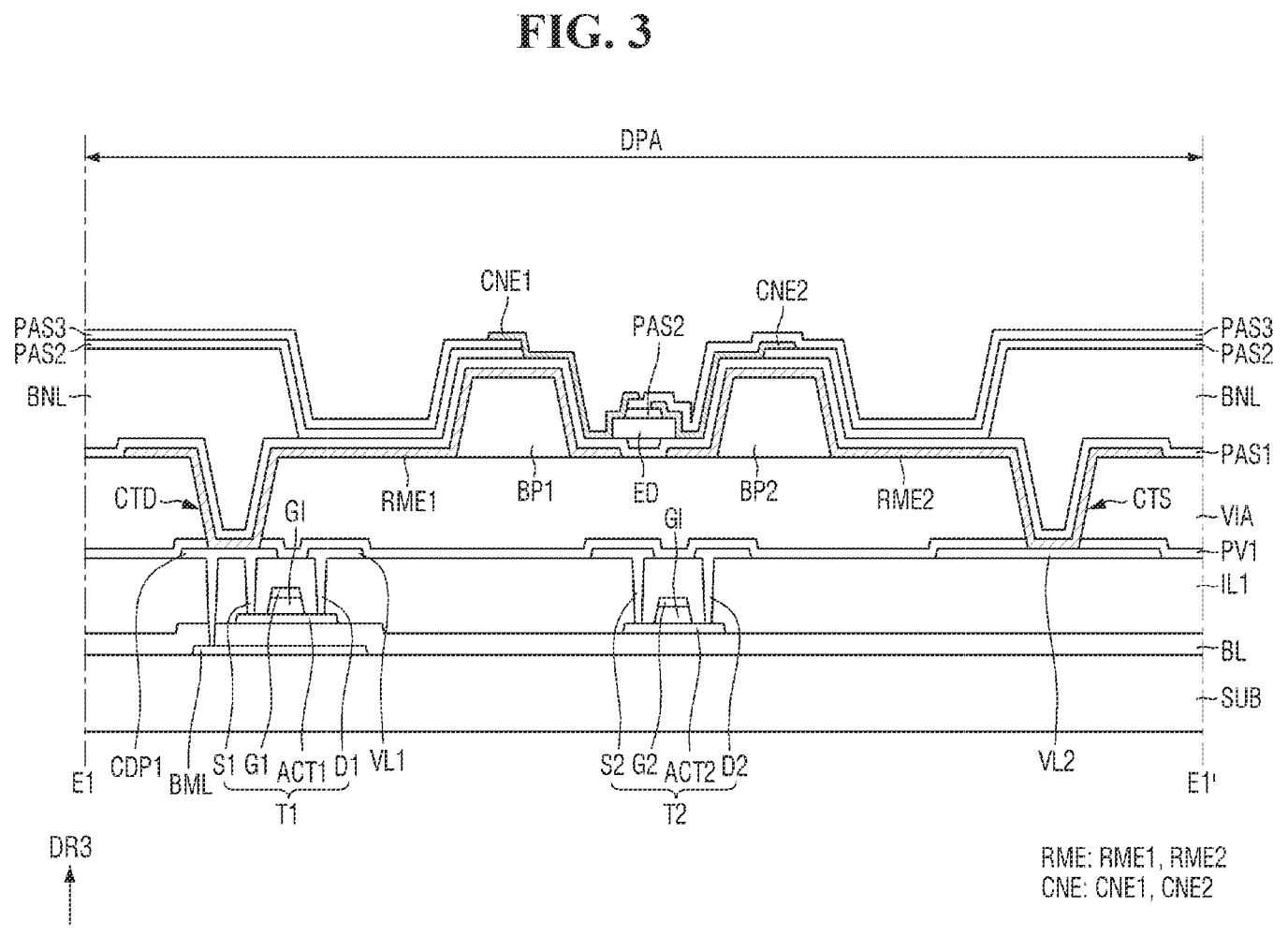
Figure 4:
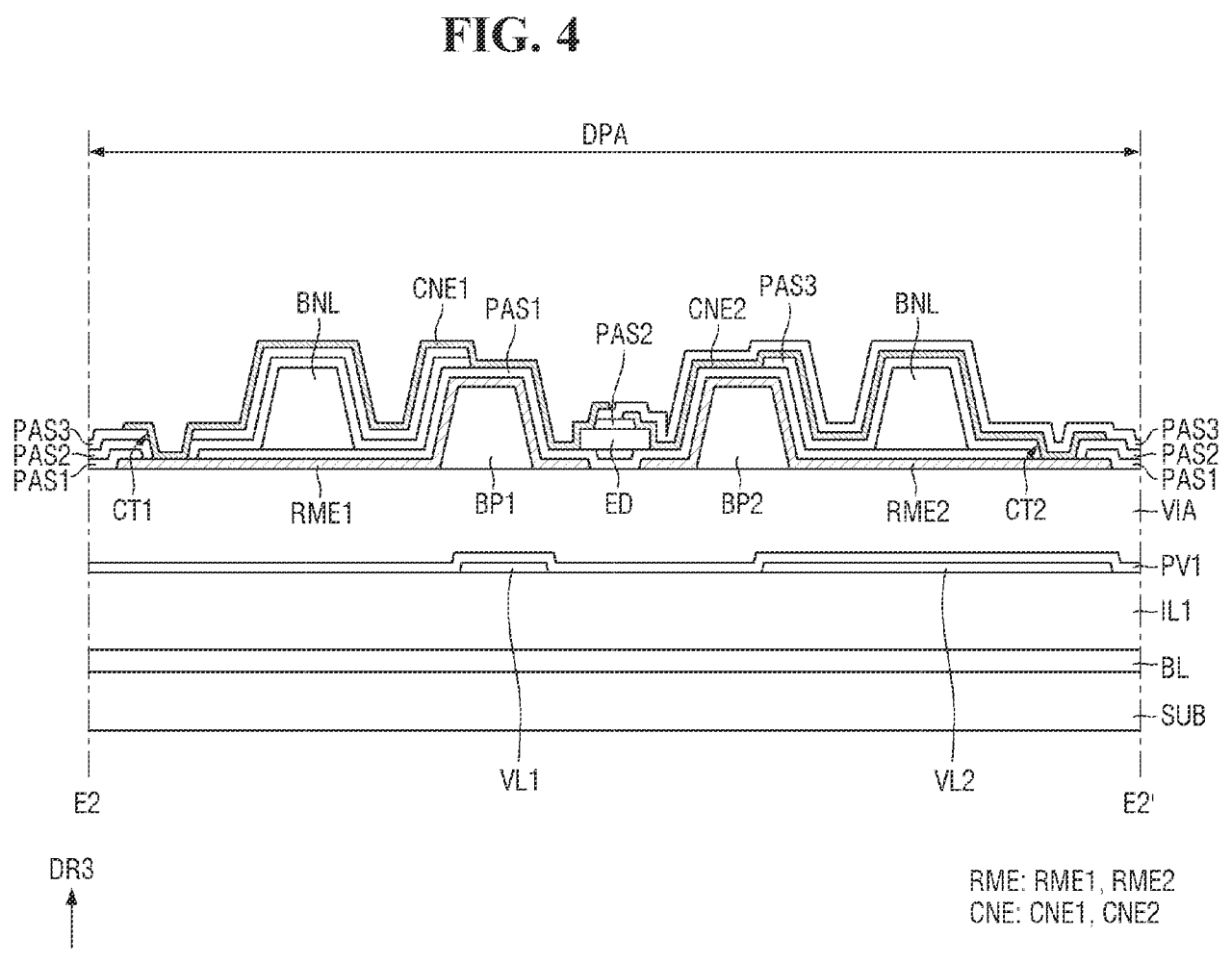

FIG. 3 is a cross-sectional view taken along the line E1-E1' of FIG. 2. FIG. 4 is a cross-sectional view taken along the line E2-E2' of FIG. 2.

FIG. 3 illustrates a cross section across both ends of the light emitting element ED and electrode contact holes CTD and CTS located in the first sub-pixel SPX1. FIG. 4 illustrates a cross section across both ends of the light emitting element ED and contact portions CT1 and CT2 located in the first sub-pixel SPXn.

The cross-sectional structure of the display device 10 is described with reference to FIGS. 2 to 4. The display device 10 may include a substrate SUB and a semiconductor layer, a plurality of conductive layers, and a plurality of insulating layers located thereon. In addition, the display device 10 may include the plurality of electrodes RME (RME1 and RME2), the light emitting element ED, and the connection electrodes CNE (CNE1 and CNE2). Each of the semiconductor layer, the conductive layer, and the insulating layer may constitute a circuit layer (CCL in FIG. 6) of the display device 10.

The substrate SUB may be an insulating substrate. The substrate SUB may be made of an insulating material, such as glass, quartz, or polymer resin. Further, the substrate SUB may be a rigid substrate, but may also be a flexible substrate that can be bent, folded or rolled. The substrate SUB may include the display area DPA and the non-display area NDA surrounding the display area DPA, and the display area DPA may include the emission area EMA and the sub-region SA that is a portion of the non-emission area.

A first conductive layer may be located on the substrate SUB. The first conductive layer includes a lower metal layer BML that overlaps a first active layer ACT1 of a first transistor T1. The lower metal layer BML may reduce or prevent light entering the first active layer ACT1 of the first transistor T1, or may be electrically connected to the first active layer ACT1 to stabilize electrical characteristics of the first transistor T1. However, the lower metal layer BML may be omitted.

The buffer layer BL may be located on (e.g., above) the lower metal layer BML and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer is located on the buffer layer BL. The semiconductor layer may include the first active layer ACT1 of the first transistor T1 and a second active layer ACT2 of the second transistor T2. The first active layer ACT1 and the second active layer ACT2 may be located to partially overlap a first gate electrode G1 and a second gate electrode G2 of a second conductive layer to be described later, respectively.

The semiconductor layer may include polycrystalline silicon, monocrystalline silicon, oxide semiconductor, and the like. In one or more other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that the first transistor T1 and the second transistor T2 are located in the sub-pixel SPXn of the display device 10, the present disclosure is not limited thereto, and the display device 10 may include a larger number of transistors.

A first gate insulating layer G1 is located on the semiconductor layer in the display area DPA. The first gate insulating layer G1 may serve as a gate insulating layer of each of the transistors T1 and T2. Although it is illustrated in the drawing that the first gate insulating layer G1 is patterned together with the gate electrodes G1 and G2 of the second conductive layer, as will be described later, and is partially located between the second conductive layer and the active layers ACT1 and ACT2 of the semiconductor layer, the present disclosure is not limited thereto. In some embodiments, the first gate insulating layer G1 may be entirely located on the buffer layer BL (e.g., located to substantially cover an entirety of the buffer layer BL).

The second conductive layer is located on the first gate insulating layer G1. The second conductive layer may include a first gate electrode G1 of the first transistor T1 and a second gate electrode G2 of the second transistor T2. The first gate electrode G1 may overlap the channel region of the first active layer ACT1 in a third direction DR3 that is a thickness direction, and the second gate electrode G2 may overlap the channel region of the second active layer ACT2 in the third direction DR3 that is the thickness direction.

A first interlayer insulating layer IL1 is located on the second conductive layer. The first interlayer insulating layer IL1 may function as an insulating film between the second conductive layer and other layers located thereon, and may protect the second conductive layer.

A third conductive layer is located on the first interlayer insulating layer IL1. The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2, which are located in the display area DPA.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A portion of the first voltage line VL1 may contact the first active layer ACT1 of the first transistor T1 through a contact hole that passes through the first interlayer insulating layer IL1. The first voltage line VL1 may serve as a first drain electrode D1 of the first transistor T1. The second voltage line VL2 may be directly connected to the second electrode RME2 to be described later.

The first conductive pattern CDP1 may contact the first active layer ACT1 of the first transistor T1 through the contact hole penetrating the first interlayer insulating layer IL1. The first conductive pattern CDP1 may contact the lower metal layer BML through another contact hole penetrating the first interlayer insulating layer IL1 and the buffer layer BL. The first conductive pattern CDP1 may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may contact the second active layer ACT2 of the second transistor T2 through the contact holes penetrating the first interlayer insulating layer IL1.

A first passivation layer PV1 is located on the third conductive layer. The first passivation layer PV1 may function as an insulating layer between the third conductive layer and other layers, and may protect the third conductive layer.

The buffer layer BL, the first gate insulating layer G1, the first interlayer insulating layer IL1, and the first passivation layer PV1 described above may be formed of a plurality of inorganic layers stacked in an alternating manner. For example, the buffer layer BL, the first gate insulating layer G1, the first interlayer insulating layer IL1, and the first passivation layer PV1 may be formed as a double layer formed by stacking, or may be formed as a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer G1, the first interlayer insulating layer IL1, and the first passivation layer PV1 may be formed as a single inorganic layer containing the above-described insulating material. Further, in some embodiments, the first interlayer insulating layer IL1 may be made of an organic insulating material, such as polyimide (PI) or the like.

A via layer VIA is located on the third conductive layer in the display area DPA. The via layer VIA may contain an organic insulating material (e.g., polyimide (PI)), and may compensate the stepped portion formed by the conductive layers located thereunder to flatten the top surface. However, in some embodiments, the via layer VIA may be omitted.

The display device 10 may include, as a display element layer located on the via layer VIA, the bank patterns BP1 and BP2, the plurality of electrodes RME (RME1 and RME2), the bank layer BNL, the plurality of light emitting elements ED, and the plurality of connection electrodes CNE (CNE1 and CNE2). In addition, the display device 10 may include the insulating layers PAS1, PAS2, PAS3, and PAS4 located on the via layer VIA.

The plurality of bank patterns BP1 and BP2 may be located on the via layer VIA. For example, each of the bank patterns BP1 and BP2 may be directly located on the via layer VIA, and may have a structure in which at least a part thereof protrudes from the top surface of the via layer VIA. The protruding portions of the bank patterns BP1 and BP2 may have an inclined surface or a curved surface with a corresponding curvature, and the light emitted from the light emitting element ED may be reflected by the electrode RME located on the bank patterns BP1 and BP2 and emitted in the upward direction of the via layer VIA. Unlike the example illustrated in the drawing, the bank patterns BP1 and BP2 may have a shape (e.g., a semicircular or semi-elliptical shape) in which the outer surface is curved with a corresponding curvature in cross-sectional view. The bank patterns BP1 and BP2 may include an organic insulating material, such as polyimide (PI), but is not limited thereto.

The plurality of electrodes RME (RME1 and RME2) may be located on the bank patterns BP1 and BP2 and the via layer VIA. For example, the first electrode RME1 and the second electrode RME2 may be located on at least inclined side surfaces of the bank patterns BP1 and BP2. The widths of the plurality of electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a portion of the first electrode RME1 and the second electrode RME2 may be directly arranged on the via layer VIA, so that the first electrode RME1 and the second electrode RME2 may be arranged on the same plane.

The light emitting element ED located between the bank patterns BP1 and BP2 may emit light toward both ends, and the emitted light may be directed toward the electrodes RME located on the bank patterns BP1 and BP2. The electrodes RME may have a structure in which portions thereof located on the bank patterns BP1 and BP2 may reflect the light emitted from the light emitting element ED. The first electrode RME1 and the second electrode RME2 may be arranged to cover at least one of side surfaces of the bank patterns BP1 and BP2, and may reflect the light emitted from the light emitting element ED.

The electrodes RME may directly contact the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may contact the first conductive pattern CDP1 through the first electrode contact hole CTD penetrating the via layer VIA and the first passivation layer PV1. The second electrode RME2 may contact the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the present disclosure is not limited thereto. In one or more other embodiments, the electrodes RME1 and RME2 may not be electrically connected to the voltage lines VL1 and VL2 of the third conductive layer, respectively, and the connection electrode CNE to be described later may be directly connected to the third conductive layer.

The plurality of electrodes RME may include a conductive material having high reflectivity. For example, the electrodes RME may contain a metal, such as silver (Ag), copper (Cu), or aluminum (Al), or may contain an alloy including aluminum (Al), nickel (Ni), lanthanum (La), or the like. Alternatively, the electrodes RME may have a structure in which a metal layer, such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

The present disclosure is not limited thereto, and each electrode RME may further include a transparent conductive material. For example, each electrode RME may include a material, such as ITO, IZO, and ITZO. In some embodiments, each of the electrodes RME may have a structure in which at least one transparent conductive material and at least one metal layer having high reflectivity are stacked, or may be formed as one layer. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the substrate SUB.

The first insulating layer PAS1 may be located in the entire display area DPA (e.g., may substantially cover an entirety of the display area DPA), and may be located on or above the via layer VIA and the plurality of electrodes RME. The first insulating layer PAS1 may include an insulating material to protect the plurality of electrodes RME, and may insulate respective electrodes RME from each other. The first insulating layer PAS1 may cover the electrodes RME before the bank layer BNL is formed, so that it is possible to reduce or prevent the likelihood of the electrodes RME being damaged in a process of forming the bank layer BNL. In addition, the first insulating layer PAS1 may reduce or prevent the likelihood of the light emitting element ED located thereon being damaged by direct contact with other members.

In one or more embodiments, the first insulating layer PAS1 may have stepped portions such that the top surface thereof is partially depressed between the electrodes RME spaced apart in the second direction DR2. The light emitting element ED may be located on the top surface of the first insulating layer PAS1, where the stepped portions are formed, and thus a space may remain between the light emitting element ED and the first insulating layer PAS1.

The first insulating layer PAS1 may include the contact portions CT1 and CT2 located in the sub-region SA. The contact portions CT1 and CT2 may overlap different electrodes RME, respectively. For example, the contact portions CT1 and CT2 may include first contact portions CT1 overlapping the first electrode RME1, and second contact portions CT2 overlapping the second electrode RME2. The first contact portions CT1 and the second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers located on the first insulating layer PAS1. The electrode RME exposed by each of the contact portions CT1 and CT2 may contact the connection electrode CNE.

The bank layer BNL may be located on the first insulating layer PAS1. The bank layer BNL may include portions extending in the first direction DR1 and the second direction DR2, and may surround the sub-pixels SPXn. The bank layer BNL may surround and delimit the emission area EMA and the sub-region SA of each sub-pixel SPXn, and may surround the outermost portion of the display area DPA, and may delimit the display area DPA and the non-display area NDA.

Similarly to the bank patterns BP1 and BP2, the bank layer BNL may have a corresponding height. In some embodiments, the top surface of the bank layer BNL may be higher than that of the bank patterns BP1 and BP2, and the thickness of the bank layer BNL may be equal to or greater than that of the bank patterns BP1 and BP2. The bank layer BNL may reduce or prevent ink overflowing to adjacent sub-pixels SPXn in an inkjet printing process during the manufacturing process of the display device 10. Similarly to the bank patterns BP1 and BP2, the bank layer BNL may include an organic insulating material, such as polyimide.

The plurality of light emitting elements ED may be arranged in the emission area EMA. The light emitting elements ED may be located on the first insulating layer PAS1 between the bank patterns BP1 and BP2. The light emitting element ED may be located such that one direction in which the light emitting element ED extends is parallel to the top surface of the substrate SUB. As will be described later, the light emitting element ED may include a plurality of semiconductor layers arranged along one direction in which the light emitting element ED extends, and the plurality of semiconductor layers may be sequentially arranged to be substantially parallel to the top surface of the substrate SUB. However, the present disclosure is not limited thereto, and the plurality of semiconductor layers may be arranged to be substantially perpendicular to the substrate SUB when the light emitting element ED has another structure.

The light emitting elements ED located in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer of the same material, and may emit light of the same color.

The light emitting elements ED may be electrically connected to the electrode RME and the conductive layers below the via layer VIA while contacting the connection electrodes CNE (CNE1 and CNE2), and may emit light of a corresponding wavelength band by receiving an electrical signal.

The second insulating layer PAS2 may be located on the plurality of light emitting elements ED, the first insulating layer PAS1, and the bank layer BNL. The second insulating layer PAS2 may include a pattern portion located on the plurality of light emitting elements ED while extending in the first direction DR1 between the bank patterns BP1 and BP2. The pattern portion is located to partially surround the outer surface of the light emitting element ED, and may not cover both sides or both ends of the light emitting element ED. The pattern portion may form a linear or island-like pattern in each sub-pixel SPXn in plan view. The pattern portion of the second insulating layer PAS2 may protect the light emitting element ED, and may fix the light emitting elements ED during a manufacturing process of the display device 10. Further, the second insulating layer PAS2 may be located to fill the space between the light emitting element ED and the first insulating layer PAS1 thereunder. Further, a portion of the second insulating layer PAS2 may be located on the bank layer BNL and in the sub-regions SA.

The second insulating layer PAS2 may include the contact portions CT1 and CT2 located in the sub-region SA. The second insulating layer PAS2 may include the first contact portion CT1 overlapping the first electrode RME1, and the second contact portion CT2 overlapping the second electrode RME2. The contact portions CT1 and CT2 may penetrate the second insulating layer PAS2 in addition to the first insulating layer PAS1. The plurality of first contact portions CT1 and the plurality of second contact portions CT2 may partially expose the top surface of the first electrode RME1 or the second electrode RME2 located thereunder.

The plurality of connection electrodes CNE (CNE1 and CNE2) may be located on the plurality of electrodes RME and the bank patterns BP1 and BP2. The first connection electrode CNE1 may be located on the first electrode RME1 and the first bank pattern BP1. The first connection electrode CNE1 may partially overlap the first electrode RME1, and may be located across the emission area EMA and the sub-region SA over the bank layer BNL. The second connection electrode CNE2 may be located on the second electrode RME2 and the second bank pattern BP2. The second connection electrode CNE2 may partially overlap the second electrode RME2, and may be located across the emission area EMA and the sub-region SA over the bank layer BNL.

Each of the first connection electrode CNE1 and the second connection electrode CNE2 may be located on the second insulating layer PAS2, and may contact the light emitting elements ED. The first connection electrode CNE1 may partially overlap the first electrode RME1, and may contact one ends of the light emitting elements ED. The second connection electrode CNE2 may partially overlap the second electrode RME2, and may contact the other ends of the light emitting elements ED. The plurality of connection electrodes CNE are located across the emission area EMA and the sub-region SA. The connection electrodes CNE may contact the light emitting elements ED at portions located in the emission area EMA, and may be electrically connected to the third conductive layer at portions located in the sub-region SA. The first connection electrode CNE1 may contact a first end of the light emitting element ED, and the second connection electrode CNE2 may contact a second end of the light emitting element ED.

In accordance with one or more embodiments, in the display device 10, the connection electrodes CNE may contact the electrode RME through the contact portions CT1 and CT2 located in the sub-region SA. The first connection electrode CNE1 may be in contract with the first electrode RME1 through the first contact portion CT1 penetrating the first insulating layer PAS1, the second insulating layer PAS2, and the third insulating layer PAS3 in the sub-region SA. The second connection electrode CNE2 may contact the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1. The second connection electrode CNE2 may be electrically connected to the second voltage line VL2, so that the second power voltage may be applied to the second connection electrode CNE2. Each connection electrode CNE may contact the light emitting element ED in the emission area EMA to transmit the power voltage to the light emitting element ED. However, the present disclosure is not limited thereto. In some embodiments, the plurality of connection electrodes CNE may directly contact the third conductive layer, and may be electrically connected to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 is located on the second connection electrode CNE2 and the second insulating layer PAS2. The third insulating layer PAS3 may be located on the entire second insulating layer PAS2 to cover the second connection electrode CNE2. The first connection electrode CNE1 may be located on the third insulating layer PAS3. The third insulating layer PAS3 may insulate the first connection electrode CNE1 and the second connection electrode CNE2 to reduce or prevent the likelihood of direct contact therebetween.

The third insulating layer PAS3 may include, or define, the first contact portions CT1 located in the sub-region SA. The first contact portion CT1 may penetrate the third insulating layer PAS3 in addition to the first insulating layer PAS1 and the second insulating layer PAS2. The plurality of first contact portions CT1 may partially expose the top surface of the first electrode RME1 located thereunder.

Although not illustrated in the drawings, another insulating layer (PAS4 in FIG. 6) may be further located on the third insulating layer PAS3 and the first connection electrode CNE1. The insulating layer may function to protect the members located on the substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may include an inorganic insulating material. Alternatively, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which a plurality of insulating layers are stacked alternately or repeatedly. In one or more embodiments, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. Alternatively, some of them may be made of the same material with one or more others being made of different materials.

Figure 5:
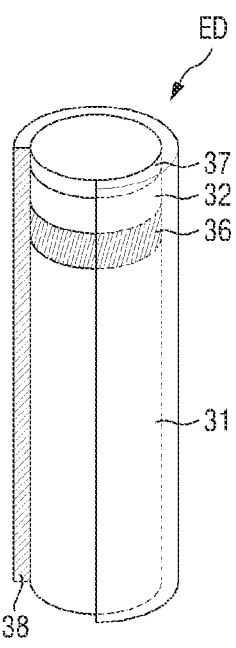
FIG. 5 is a schematic diagram of a light emitting element according to one or more embodiments.

FIG. 5 is a schematic diagram of a light emitting element according to one or more embodiments.

Referring to FIG. 5, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a corresponding direction between two electrodes facing each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape, such as a regular cube, a rectangular parallelepiped and a hexagonal prism, or may have various shapes, such as a shape elongated in one direction and having an outer surface partially inclined.

The light emitting element ED may include a semiconductor layer doped with any conductivity type (e.g., p-type or n-type) dopant. The semiconductor layer may emit light of a corresponding wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn1-x-yN$ ($0\leq x\leq1$, $0\leq y\leq1$, $0\leq x+y\leq1$). For example, the first semiconductor layer 31 may be any one or more of AlGaInN, GaN, AlGaN, InGaN, AlN, and InN doped with an n-type dopant. The n-type dopant doped into the first semiconductor layer 31 may be Si, Ge, Sn, or the like.

The second semiconductor layer 32 is located on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn1-x-yN$ ($0\leq x\leq1$, $0\leq y\leq1$, $0\leq x+y\leq1$). For example, the second semiconductor layer 32 may be any one or more of AlGaInN, GaN, AlGaN, InGaN, AlN, and InN doped with a p-type dopant. The p-type dopant doped into the second semiconductor layer 32 may be Mg, Zn, Ca, Ba, or the like.

Meanwhile, although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer located between the first semiconductor layer 31 and the light emitting layer 36, or between the second semiconductor layer 32 and the light emitting layer 36. The semiconductor layer located between the first semiconductor layer 31 and the light emitting layer 36 may be one or more of AlGaInN, GaN, AlGaN, InGaN, AlN, InN, and SLs doped with an n-type dopant, and the semiconductor layer located between the second semiconductor layer 32 and the light emitting layer 36 may be one or more of AlGaInN, GaN, AlGaN, InGaN, AlN, and InN doped with a p-type dopant.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material, such as AlGaN, AlGaInN, or InGaN. For example, when the light emitting layer 36 has a multiple quantum well structure in which quantum layers and well layers are alternately stacked, the quantum layer may include a material, such as AlGaN or AlGaInN, and the well layer may include a material, such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted in one or more embodiments.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround the outer surfaces of the plurality of semiconductor layers and electrode layers described above. For example, the insulating film 38 may be located to surround at least the outer surface of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the present disclosure is not limited thereto. In some embodiments, the insulating film 38 may be formed in a multilayer structure having a plurality of layers stacked therein.

The insulating film 38 may perform a function of protecting the semiconductor layers and the electrode layer of the light emitting element ED. The insulating film 38 may reduce or prevent the likelihood of an electrical short circuit that may occur at the light emitting layer 36 when an electrode to which an electrical signal is transmitted directly contacts the light emitting element ED. In addition, the insulating film 38 may reduce or prevent a decrease in luminous efficiency of the light emitting element ED.

Further, the insulating film 38 may have an outer surface that is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property to keep the light emitting elements ED in the dispersed state without being aggregated with other adjacent light emitting elements ED in the ink.

According to one or more embodiments, the display device 10 may further include a color control layer (CCR in FIG. 6) and a color filter layer (CFL in FIG. 6) located on the light emitting elements ED. Light emitted from the light emitting element ED may be emitted through the color control layer CCR and the color filter layer CFL. Even if the same type of the light emitting elements ED are located in the respective sub-pixels SPXn, the color of the emitted light may be different for each sub-pixel SPXn.

Figure 6:
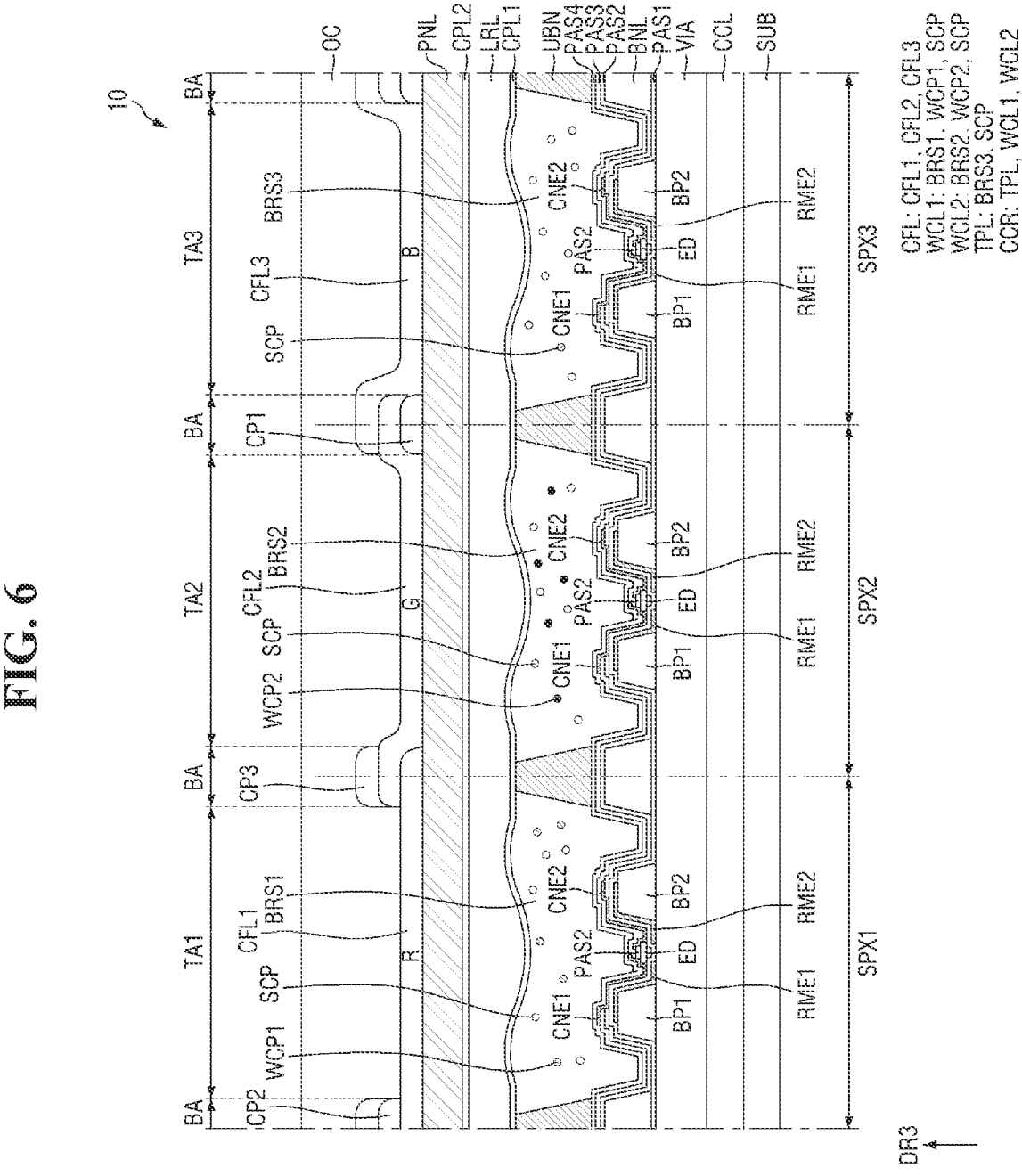
FIG. 6 is a cross-sectional view of a display device according to one or more embodiments.

FIG. 6 is a cross-sectional view of a display device according to one or more embodiments.

Referring to FIG. 6, the display device 10 may include the light emitting elements ED located on the substrate SUB, the color control layer TPL, WCL1, and WCL2, and the color filter layer CFL that are located thereabove. Further, the display device 10 may further include a plurality of layers located between the color control layer CCR and the color filter layer CFL. Hereinafter, the layers located on the light emitting elements ED of the display device 10 will be described.

The fourth insulating layer PAS4 may be located on the third insulating layer PAS3, the connection electrodes CNE1 and CNE2, and the bank layer BNL. The fourth insulating layer PAS4 may protect the layers located on/above the substrate SUB. However, the fourth insulating layer PAS4 may be omitted.

An upper bank layer UBN, the color control layer CCR, color patterns CP1, CP2, and CP3, and the color filter layer CFL may be located on the fourth insulating layer PAS4. A plurality of capping layers CPL1 and CPL2, a low refractive index layer LRL, and a planarization layer PNL may be located between the color control layer CCR and the color filter layer CFL. An overcoat layer OC may be located on the color filter layer CFL.

The display device 10 may include light transmitting areas TA1, TA2, and TA3 in which the color filter layer CFL is located to emit light, and a light blocking area BA located between the light transmitting areas TA1, TA2, and TA3 and in which light is not emitted. The light transmitting areas TA1, TA2, and TA3 may be located to correspond to a portion of the emission area EMA of each sub-pixel SPXn, and the light blocking area BA may be an area other than the light transmitting areas TA1, TA2, and TA3.

The upper bank layer UBN may be located on the fourth insulating layer PAS4 to overlap the bank layer BNL. The upper bank layer UBN may include portions extending in the first direction DR1 and the second direction DR2 to be located in a grid pattern. The upper bank layer UBN may surround the emission area EMA or a portion in which the light emitting elements ED are located. The upper bank layer UBN may form a region in which the color control layer CCR is located.

The color control layer CCR may be located in a region surrounded by the upper bank layer UBN on the fourth insulating layer PAS4. The color control layer CCR may be located in the light transmitting areas TA1, TA2, and TA3 surrounded by the upper bank layer UBN to form an island-like pattern in the display area DPA. However, the present disclosure is not limited thereto, and each of the color control layers CCR may extend in one direction and may be located across the plurality of sub-pixels SPXn to form a linear pattern.

In embodiments in which the light emitting element ED of each sub-pixel SPXn emits blue light of the third color, the color control layer CCR may include the first wavelength conversion layer WCL1 located in the first sub-pixel SPX1 to correspond to a first light transmitting area TA1, the second wavelength conversion layer WCL2 located in the second sub-pixel SPX2 to correspond to a second light transmitting area TA2, and the light transmitting layer TPL located in the third sub-pixel SPX3 to correspond to a third light transmitting area TA3.

The first wavelength conversion layer WCL1 may include a first base resin BRS1, and a first wavelength conversion material WCP1 provided in the first base resin BRS1. The second wavelength conversion layer WCL2 may include a second base resin BRS2, and a second wavelength conversion material WCP2 provided in the second base resin BRS2. The first wavelength conversion layer WCL1 and the second wavelength conversion layer WCL2 may transmit the blue light of the third color incident from the light emitting element ED while converting the wavelength thereof. The first wavelength conversion layer WCL1 and the second wavelength conversion layer WCL2 may further include a scatterer SCP contained in each base resin, and the scatterer SCP may increase wavelength conversion efficiency.

The light transmitting layer TPL may include a third base resin BRS3 and the scatterer SCP contained in the third base resin BSR3. The light transmitting layer TPL transmits the blue light of the third color incident from the light emitting element ED while maintaining the wavelength thereof. The scatterer SCP of the light transmitting layer TPL may serve to control an emission path of the light emitted through the light transmitting layer TPL. The light transmitting layer TPL may omit a wavelength conversion material.

The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be formed of the same material, but the present disclosure is not limited thereto.

The first wavelength conversion material WCP1 may convert the blue light of the third color into the red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors, or the like. Examples of the quantum dot may include group IV nanocrystal, group II-VI compound nanocrystal, group III-V compound nanocrystal, group IV-VI nanocrystal, and a combination thereof.

In some embodiments, the color control layer CCR may be formed by an inkjet printing process or a photoresist process. The color control layer CCR may be formed through drying or exposure, and through development processes after a material constituting the color control layer CCR is sprayed into or coated on the region surrounded by the upper bank layer UBN. For example, in the drawing of one or more embodiments in which the color control layer CCR is formed by an inkjet printing process, the top surface of each color control layer CCR is formed to be curved, so that the edge portion thereof adjacent to the upper bank layer UBN may be higher than the center portion thereof. However, the present disclosure is not limited thereto. In one or more embodiments in which the color control layer CCR is formed by a photoresist process, the top surface of each color control layer CCR is formed to be flat, so that the edge portion adjacent to the upper bank layer UBN may be parallel to the top surface of the upper bank layer UBN. Alternatively, unlike the drawing, the center portion of the color control layer CCR may be formed to be higher than the edge portion thereof.

The light emitting element ED of each sub-pixel SPXn may emit the blue light of the same third color, and the sub-pixels SPXn may emit lights of different colors. For example, the light emitted from the light emitting element ED located in the first sub-pixel SPX1 is incident on the first wavelength conversion layer WCL1, the light emitted from the light emitting element ED located in the second sub-pixel SPX2 is incident on the second wavelength conversion layer WCL2, and the light emitted from the light emitting element ED located in the third sub-pixel SPX3 is incident on the light transmitting layer TPL.

The light incident on the first wavelength conversion layer WCL1 may be converted into red light, the light incident on the second wavelength conversion layer WCL2 may be converted into green light, and the light incident on the light transmitting layer TPL may be transmitted as the same blue light without wavelength conversion. Although each sub-pixel SPXn includes the light emitting elements ED that emit light of the same color, light of different colors may be emitted according to the arrangement of the color control layers CCR located thereabove.

The first capping layer CPL1 may be located on the color control layer CCR and the upper bank layer UBN. The first capping layer CPL1 may reduce or prevent impurities, such as moisture or air, permeating from the outside and damaging or contaminating the color control layer CCR. The first capping layer CPL1 may contain an inorganic insulating material.

The low refractive layer LRL may be located on the first capping layer CPL1. The low refractive layer LRL, which is an optical layer for recycling the light having transmitted the color control layer CCR, may improve the light emission efficiency and the color purity of the display device 10. The low refractive index layer LRL may be made of an organic material having a low refractive index, and may compensate a stepped portion formed by the color control layer CCR and the upper bank layer UBN.

The second capping layer CPL2 may be located on the low refractive layer LRL, and may reduce or prevent impurities, such as moisture, air, or the like, permeating from the outside and damaging or contaminating the low refractive layer LRL. The second capping layer CPL2 may include an inorganic insulating material similarly to the first capping layer CPL1.

The planarization layer PNL may be located across the entire display area DPA and the entire non-display area NDA on the second capping layer CPL2. The planarization layer PNL may overlap the color control layer CCR in the display area DPA, and may overlap a dam, which will be described later, in the non-display area NDA.

The planarization layer PNL may protect the members located on the substrate SUB in addition to the plurality of capping layers CPL1 and CPL2 and the low refractive layer LRL, and may partially compensate the stepped portion formed by them. For example, the planarization layer PNL may compensate the stepped portion formed by the color control layer CCR, the upper bank layer UBN, and the bank layer BNL thereunder in the display area DPA. Therefore, the color filter layer CFL located thereon may be formed on a planar surface.

The color filter layer CFL may be located on the planarization layer PNL. The color filter layer CFL may be located in the light transmitting areas TA1, TA2, and TA3, and a part thereof may be located in the light blocking area BA. The portion of the color filter layer CFL may overlap a portion of another color filter layer CFL or the color patterns CP1, CP2, and CP3 in the light blocking area BA. A portion where the color filter layers CFL do not overlap each other may be the light transmitting area TA1, TA2, or TA3 from which light is emitted. An area where the color filter layers CFL overlap each other or where the color patterns CP1, CP2, and CP3 are located may be the light blocking area BA in which light is blocked.

The color filter layer CFL may include a first color filter CFL1 located in the first sub-pixel SPX1, a second color filter CFL2 located in the second sub-pixel SPX2, and a third color filter CFL3 located in the third sub-pixel SPX3. Each of the color filters CFL1, CFL2, and CFL3 may be formed in a linear pattern located in the plurality of light transmitting areas TA1, TA2, and TA3 or the plurality of emission areas EMA. However, the present disclosure is not limited thereto. The color filters CFL1, CFL2, and CFL3 may be located to correspond to the light transmitting areas TA1, TA2, and TA3, respectively, and may form an island-like pattern.

The color filter layer CFL may contain a colorant, such as a dye or a pigment that absorbs light of a wavelength other than a corresponding wavelength. Each of the color filters CFL1, CFL2, and CFL3 may be located for each sub-pixel SPXn and may transmit only a portion of light incident on each of the color filters CFL1, CFL2, and CFL3 in the corresponding sub-pixel SPXn. In each sub-pixel SPXn of the display device 10, only light transmitted through each of the color filters CFL1, CFL2, and CFL3 may be selectively displayed. In one or more embodiments, the first color filter CFL1 may be a red color filter layer, the second color filter CFL2 may be a green color filter layer, and the third color filter CFL3 may be a blue color filter layer. Lights emitted from the light emitting element ED may be emitted through the color control layer CCR and the color filter layer CFL.

The color patterns CP1, CP2, and CP3 may be located on the planarization layer PNL or the color filter layer CFL. The color patterns CP1, CP2, and CP3 may include the same material as the color filter layer CFL, and may be located in the light blocking area BA. In the light blocking area BA, the color patterns CP1, CP2, and CP3 and the different color filters CFL1, CFL2, and CFL3 may be stacked, and light may be blocked in the stacked area.

The first color pattern CP1 may be made of the same material as that of the first color filter CFL1, and may be located in the light blocking area BA. The first color pattern CP1 may be directly located on the planarization layer PNL in the light blocking area BA, and may be omitted from the light blocking area BA that is adjacent to the first light transmitting area TA1 of the first sub-pixel SPX1. The first color pattern CP1 may be located in the light blocking area BA between the second sub-pixel SPX2 and the third sub-pixel SPX3 (e.g., another third sub-pixel). The first color filter CFL1 may be located in the light blocking area BA around the first sub-pixel SPX1.

The second color pattern CP2 may be made of the same material as that of the second color filter CFL2 and may be located in the light blocking area BA. The second color pattern CP2 may be directly located on the planarization layer PNL in the light blocking area BA, and may be omitted from the light blocking area BA that is adjacent to the second light transmitting area TA2 of the second sub-pixel SPX2. The second color pattern CP2 may be located in the light blocking area BA between the first sub-pixel SPX1 and the third sub-pixel SPX3, or at the boundary between the outermost sub-pixel SPXn of the display area DPA and the non-display area NDA. The second color filter CFL2 may be located in the light blocking area BA around the second sub-pixel SPX2.

Similarly, the third color pattern CP3 may be made of the same material as that of the third color filter CFL3, and may be located in the light blocking area BA. The third color pattern CP3 may be directly located on the planarization layer PNL in the light blocking area BA, and may be omitted from the light blocking area BA that is adjacent to the third light transmitting area TA3 of the third sub-pixel SPX3. The third color pattern CP3 may be located in the light blocking area BA between the first sub-pixel SPX1 (e.g., another first sub-pixel) and the second sub-pixel SPX2. The third color filter CFL3 may be located in the light blocking area BA around the third sub-pixel SPX3.

In the display device 10, an area where the bank layer BNL and the upper bank layer UBN overlap each other may become the light blocking area BA. In the light blocking area BA, each of the first color pattern CP1, the second color pattern CP2, and the third color pattern CP3 may overlap at least one of the color filters CFL1, CFL2, and CFL3, which contains a different color material. For example, the first color pattern CP1 may overlap the second color filter CFL2 and the third color filter CFL3, the second color pattern CP2 may overlap the first color filter CFL1 and the third color filter CFL3, and the third pattern CP3 may overlap the first color filter CFL1 and the second color filter CFL2. In the light blocking area BA, the color patterns CP1, CP2, and CP3, and the color filters CFL1, CFL2, and CFL3, which contain different color materials, may overlap each other, thereby blocking light.

The color patterns CP1, CP2, and CP3 and the color filters CFL1, CFL2, and CFL3 may constitute the stacked structure, and may include a material containing a different color material, thereby reducing or preventing color mixture between adjacent areas. As the color patterns CP1, CP2, and CP3 include the same material as the plurality of color filters CFL1, CFL2, and CFL3, external light or reflected light, which has passed through the light blocking area BA, may have a wavelength band of a corresponding color. The eye color sensibility perceived by user's eyes varies depending on the color of the light. For example, the light in the blue wavelength band may be perceived less sensitively to a user than the light in the green wavelength band and the light in the red wavelength band. In the display device 10, the color patterns CP1, CP2, and CP3 are located in the light blocking area BA, so that light may be blocked and a user may perceive the reflected light relatively less sensitively. Further, by absorbing a portion of light entering from the outside of the display device 10, it is possible to reduce the reflected light due to the external light.

The overcoat layer OC may be located on the color filter layer CFL and the color patterns CP1, CP2, and CP3. The overcoat layer OC may be located in the entire display area DPA (e.g., may substantially cover an entirety of the display area DPA), and may be partially located in the non-display area NDA. The overcoat layer OC may protect the members containing an organic insulating material and arranged in the display area DPA from the outside.

The display device 10 according to one or more embodiments may include the color control layer CCR and the color filter layer CFL located above the light emitting elements ED. Therefore, even if the same type of the light emitting elements ED are located for each sub-pixel SPXn, the display device 10 may display light of different colors.

For example, the light emitting element ED located in the first sub-pixel SPX1 may emit the blue light of the third color, and the light may be incident on the first wavelength conversion layer WCL1 while transmitting through the fourth insulating layer PAS4. The first base resin BRS1 of the first wavelength conversion layer WCL1 may be made of a transparent material, and a portion of the light may transmit the first base resin BRS1 and may be incident on the first capping layer CPL1 located thereon. However, at least a portion of the light may be incident on the scatterer SCP and on the first wavelength conversion material WCP1 arranged in the first base resin BRS1. The light may be scattered and subjected to wavelength conversion, and then may be incident as red light on the first capping layer CPL1. The lights incident on the first capping layer CPL1 may be incident on the first color filter CFL1 while transmitting through the low refractive layer LRL, the second capping layer CPL2, and the planarization layer PNL, and the transmission of other lights except the red light may be blocked by the first color filter CFL1. Accordingly, the first sub-pixel SPX1 may emit the red light.

Similarly, the lights emitted from the light emitting element ED located in the second sub-pixel SPX2 may be emitted as the green light while transmitting through the fourth insulating layer PAS4, the second wavelength conversion layer WCL2, the first capping layer CPL1, the low refractive layer LRL, the second capping layer CPL2, the planarization layer PNL, and the second color filter CFL2.

The light emitting element ED located in the third sub-pixel SPX3 may emit the blue light of the third color, and the blue light may be incident on the light transmitting layer while transmitting through the fourth insulating layer PAS4. The third base resin BRS3 of the light transmitting layer TPL may be made of a transparent material, and a portion of the light may transmit the third base resin BRS3 and may be incident on the capping layer CPL1 located thereon. The lights incident on the first capping layer CPL1 may be incident on the third color filter CFL3 while transmitting through the low refractive layer LRL, the second capping layer CPL2, and the planarization layer PNL, and the transmission of other lights except the blue light may be blocked by the third color filter CFL3. Accordingly, the third sub-pixel SPX3 may emit the blue light.

Figure 7:
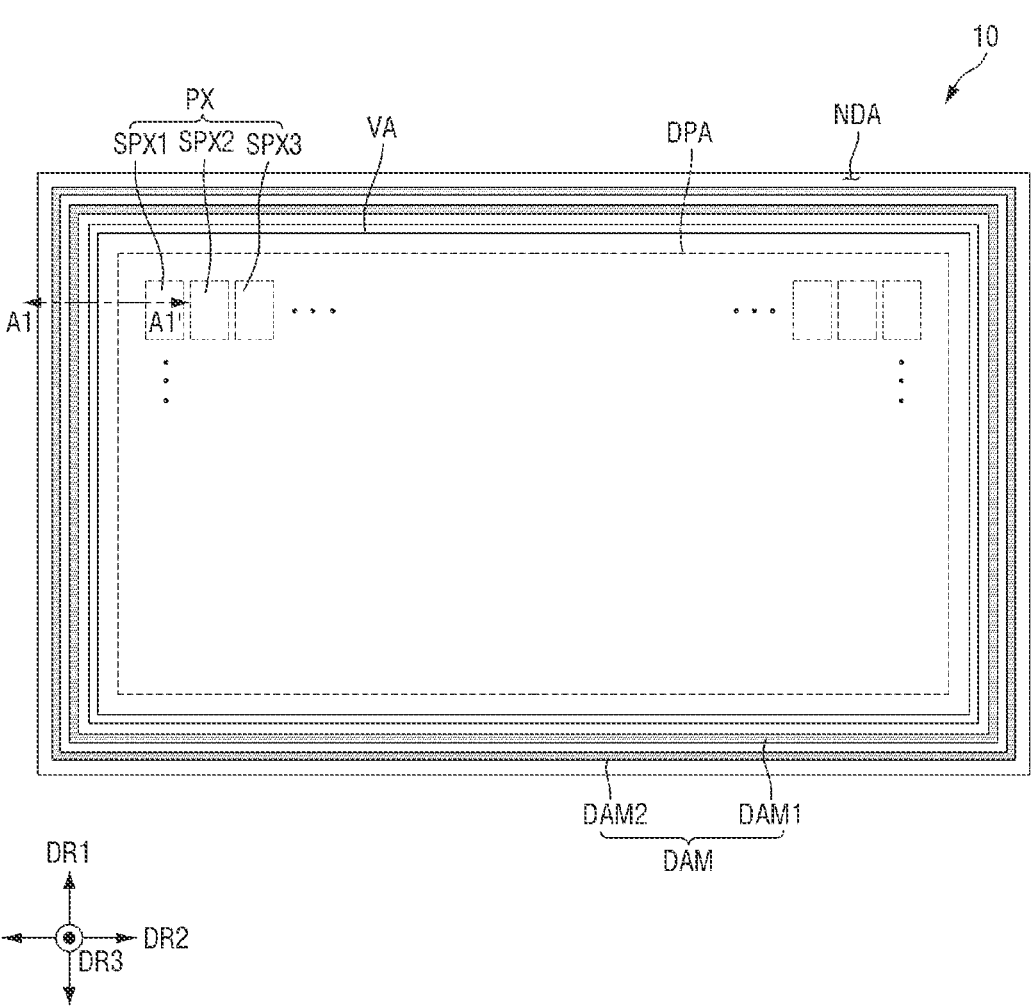
FIG. 7 is a plan view schematically illustrating a display area and a non-display area of a display device according to one or more embodiments.
Figure 8:
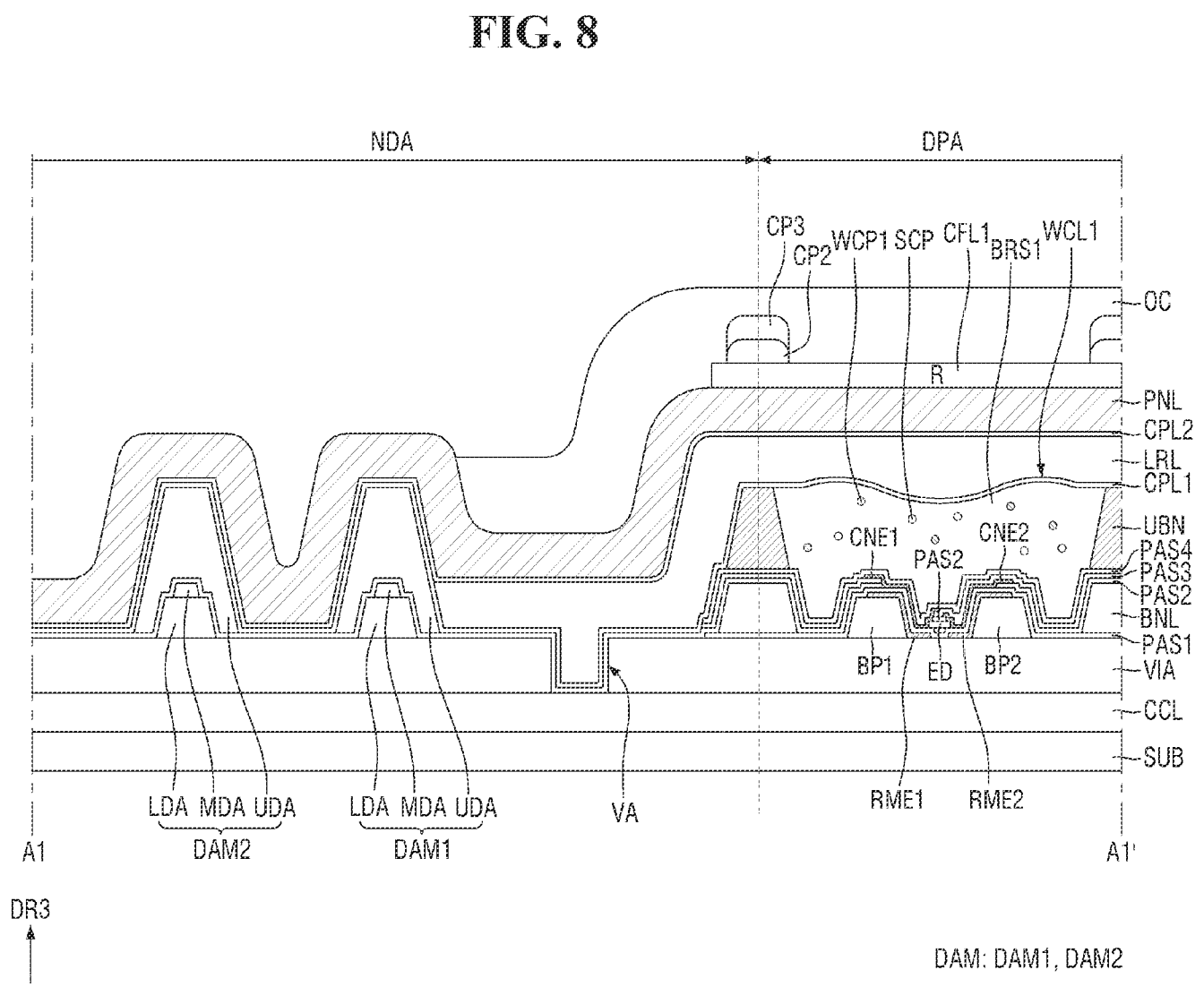
Figure 9:
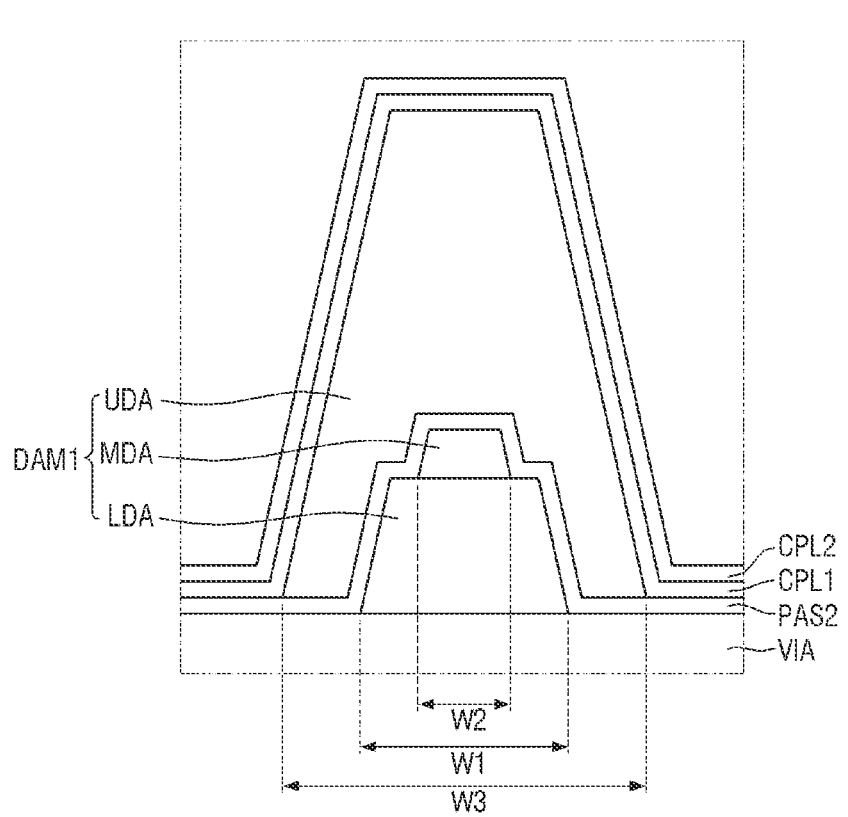
FIG. 9 is a cross-sectional view illustrating an example of a dam structure of a display device according to one or more embodiments.
Figure 10:
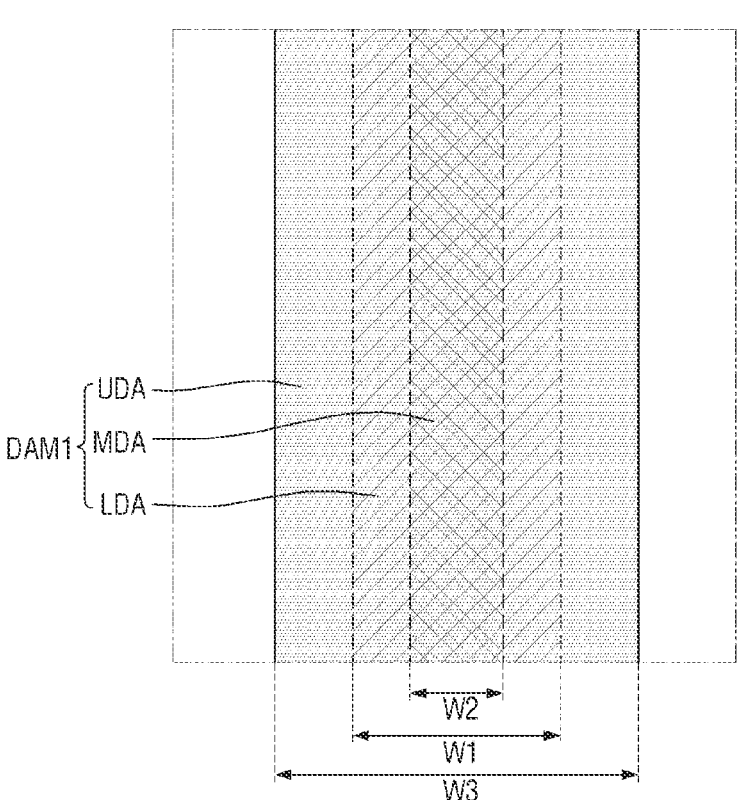
FIG. 10 is a plan view illustrating a first dam of a display device according to one or more embodiments.
Figure 11:
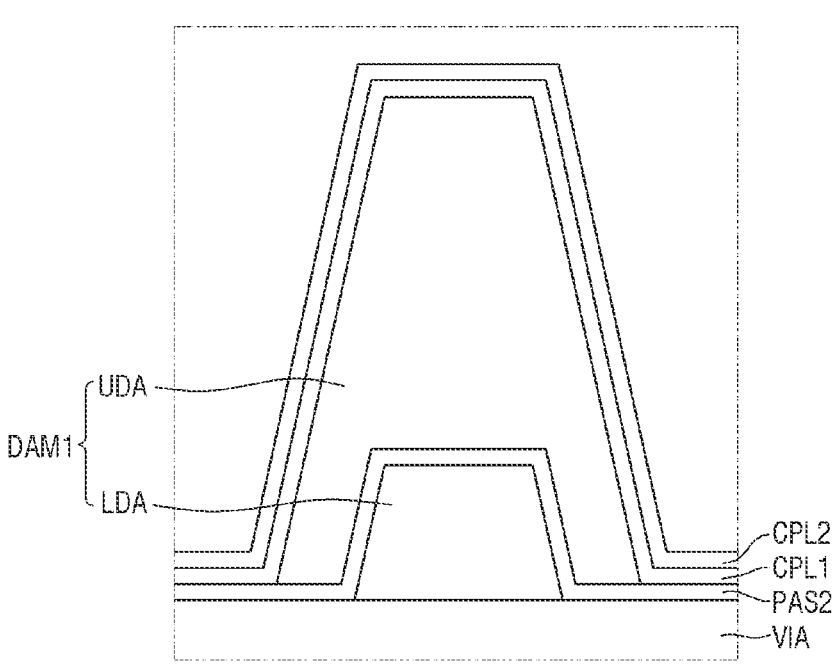
FIG. 11 is a cross-sectional view illustrating another example of a dam of a display device according to one or more embodiments.

FIG. 7 is a plan view schematically illustrating a display area and a non-display area of a display device according to one or more embodiments. FIG. 8 is a cross-sectional view taken along the line A1-A1' of FIG. 7. FIG. 9 is a cross-sectional view illustrating an example of a dam structure of a display device according to one or more embodiments. FIG. 10 is a plan view illustrating a first dam of a display device according to one or more embodiments. FIG. 11 is a cross-sectional view illustrating another example of a dam of a display device according to one or more embodiments.

FIG. 8 illustrates a cross section of portions of the display area DPA and the non-display area NDA in the outer portion of the display device 10, which are taken in the second direction DR2. FIG. 8 illustrates a left outer portion of the display device 10 that is on one side in the second direction DR2 in the outer portion of the display device 10. In FIG. 8, a plurality of conductive layers and a semiconductor layer of the display area DPA are simply illustrated as a circuit layer CCL, and descriptions thereof are the same as those made above with reference to FIGS. 2 to 4.

Referring to FIGS. 7 and 8, the display device 10 may include the upper bank layer UBN and the bank layer BNL that have portions located in the outer portion of the display area DPA, and a hole portion (e.g., a groove portion) VA and a dam structure portion DAM that are located in the non-display area NDA to surround the display area DPA.

The upper bank layer UBN and the bank layer BNL may extend in the first direction DR1 and the second direction DR2 in the display area DPA. As described above, the upper bank layer UBN may be located on the bank layer BNL, and they may be located in the same pattern shape in plan view. For example, the upper bank layer UBN and the bank layer BNL may be located in the outer portion of the display area DPA to surround the portion in which the plurality of pixels PX are located. The upper bank layer UBN and the bank layer BNL may delimit the display area DPA from the non-display area NDA, and may also delimit different sub-pixels SPXn.

The dam structure portion DAM may be located in the non-display area NDA to surround the display area DPA while being spaced apart from the upper bank layer UBN and the bank layer BNL. The dam structure portion DAM may be located to be spaced apart from the upper bank layer UBN and the bank layer BNL by an interval (e.g., predetermined interval). The display area DPA may be located inside the area surrounded by the dam structure portion DAM.

The display device 10 may have a structure in which a plurality of layers are sequentially stacked on one substrate SUB. Some of the layers of the display device 10 may be made of an organic material, and may be formed by a process of directly injecting the organic material onto the substrate SUB. Because the organic material may flow with fluidity, the organic material injected onto the display area DPA may overflow to the non-display area NDA. The dam structure portion DAM may reduce or prevent the likelihood of the organic material overflowing to the outside beyond the non-display area NDA.

The display device 10 according to one or more embodiments may include the hole portion VA located between the dam structure portion DAM, and the upper bank layer UBN and the bank layer BNL in the non-display area NDA. The dam structure portion DAM, the upper bank layer UBN, and the bank layer BNL may have a shape protruding upward from the via layer VIA, while the hole portion VA may be formed by partially recessing the via layer VIA. The hole portion VA may form engraved and embossed patterns with the dam structure portion DAM, the upper bank layer UBN, and the bank layer BNL, thereby reducing or preventing the likelihood of an organic material sprayed onto the display area DPA overflowing to the non-display area NDA.

As an encapsulation structure located on the color control layer WCL, the first capping layer CPL1 and the second capping layer CPL2 may be located to extend to the non-display area NDA. A portion of the first capping layer CPL1 may be directly located on the fourth insulating layer PAS4 shown in FIG. 6, and the other part thereof may be located on the upper bank layer UBN, the dam structure portion DAM, and the hole portion VA. The first capping layer CPL1 may be located along a stepped portion that is formed by the color control layer WCL, the upper bank layer UBN, the dam structure portion DAM, and the hole portion VA.

The second capping layer CPL2 is located on the first capping layer CPL1 with the low refractive layer LRL interposed therebetween. Because the low refractive index layer LRL does not extend across the entire surface of the non-display area NDA, a portion of the second capping layer CPL2 may be directly located on the first capping layer CPL1.

The low refractive layer LRL may be made of an organic material, and may be located in the entire display area DPA (e.g., may substantially cover an entirety of the display area DPA). In the process of coating the organic material on the first capping layer CPL1, the organic material may overflow beyond the upper bank layer UBN to the non-display area NDA located at the outermost portion of the display area DPA. For example, the display device 10 may include the single substrate SUB, and a plurality of layers may be formed thereon through consecutive processes. In the processes, the organic material that has overflowed to an undesired region of the non-display area NDA may become as a contaminant in the subsequent process. The display device 10 according to one or more embodiments may include the embossed and intaglio pattern-shaped structures arranged in the non-display area NDA, so that it is possible to reduce or prevent the likelihood of organic material overflowed to the non-display area NDA from further spreading to an undesired region.

Because the display device 10 includes the hole portion VA and the dam structure portion DAM located in the non-display area NDA, a structure, which forms intaglio and embossed patterns with respect to the top surface of the via layer VIA, may be located therein. The hole portion VA may have an engraved pattern shape that is recessed from the top surface of the via layer VIA toward the bottom surface thereof. The dam structure portion DAM may have an embossed pattern shape that protrudes upward from the top surface of the via layer VIA.

The hole portion VA may be located to be spaced apart from the upper bank layer UBN while surrounding the display area DPA in plan view. The hole portion VA may have a width (e.g., predetermined width), and may pass through the via layer VIA entirely or partially. Some layers located on the via layer VIA may be located in the hole portion VA. For example, a portion of the second insulating layer PAS2 may be located in the hole portion VA. The second insulating layer PAS2 may be located along a stepped portion formed by the hole portion VA. A portion of the first capping layer CPL1 located on the color control layer WCL may be located in the hole portion VA. The first capping layer CPL1 may include an inorganic insulating material, and may be located along the stepped portion formed by the hole portion VA in the via layer VIA. As an inorganic insulating material, such as the first capping layer CPL1 is located in the hole portion VA, it is possible to reduce or prevent the likelihood of the via layer VIA acting as a moisture permeation path.

The low refractive index layer LRL may be located on the first capping layer CPL1, and a part thereof may be located in the non-display area NDA over the upper bank layer UBN. The low refractive index layer LRL may also be located on the hole portion VA, and a part thereof may be located to fill the stepped portion formed by the hole portion VA. In the process of forming the low refractive index layer LRL, the organic material forming the low refractive index layer LRL may flow to the non-display area NDA beyond the display area DPA, and may fill the stepped portion formed by the hole portion VA. The hole portion VA and the dam structure portion DAM may reduce or prevent excessive overflow of the organic material. The low refractive index layer LRL may be continuously located up to the dam structure portion DAM while filling the hole portion VA.

The dam structure portion DAM may surround the hole portion VA while being spaced apart therefrom. The hole portion VA and the dam structure portion DAM may be located sequentially in the direction toward the outer portion of the non-display area NDA with respect to the upper bank layer UBN, while being spaced apart from each other. As the dam structure portion DAM has a shape protruding upward from the via layer VIA and has an embossed pattern shape, it is possible to reduce or prevent the likelihood of the low refractive index layer LRL overflowing to the outer portion of the non-display area NDA.

The hole portion VA may be located closer to the display area DPA than the dam structure portion DAM, and may be a primary structure for reducing or preventing overflow of the low refractive index layer LRL. The hole portion VA may have a width (e.g., predetermined width) to reduce or prevent the likelihood of the organic material of the low refractive index layer LRL overflowing. The width of the hole portion VA may be less than or equal to the width of each dam structure portion DAM. However, the present disclosure is not limited thereto, and the width of the hole portion VA may be greater than the width of each dam structure portion DAM.

The planarization layer PNL may be located in the display area DPA and the non-display area NDA on the second capping layer CPL2. In the display area DPA, the planarization layer PNL may cover the color control layer WCL, and may planarize the stepped portion caused by the color control layer WCL. In the non-display area NDA, the planarization layer PNL may be located up to the outer portion of the dam structure portion DAM over the dam structure portion DAM, and may planarize the stepped portion caused by the dam structure portion DAM.

In the non-display area NDA, at least two color filters among different types of color filters CFL1, CFL2, and CFL3 may overlap each other. For example, as shown in FIG. 8, in which the outermost sub-pixel SPXn of the display area DPA is the first sub-pixel SPX1 where the first wavelength conversion layer WCL1 is located, the first color filter CFL1 located in the first sub-pixel SPX1 may extend to the non-display area NDA. The second color pattern CP2 may be located on the first color filter CFL1 at the boundary between the display area DPA and the non-display area NDA, and the third color pattern CP3 may be located on the second color pattern CP2.

The overcoat layer OC may be located to cover the color filter layer CFL in the display area DPA, and to cover the dam structure portion DAM, the color filter layer CFL, and the planarization layer PNL in the non-display area NDA. The overcoat layer OC may have a shape in which the height of the top surface thereof gradually decreases as going from the display area DPA to the outermost portion of the non-display area NDA.

As a structure for reducing or preventing overflow of the low refractive index layer LRL, the dam structure portion DAM may be located in the non-display area NDA. The dam structure portion DAM may be located on the via layer VIA while surrounding the inner side at the outermost portion of the display area DPA. The dam structure portion DAM may include a first dam DAM1 and a second dam DAM2.

The first dam DAM1 may be located to surround the display area DPA. The first dam DAM1 may be located in the non-display area NDA while being spaced apart from the display area DPA by a distance (e.g., predetermined distance). The first dam DAM1 may be located to surround the hole portion VA while being spaced outwardly apart from the hole portion VA by a distance (e.g., predetermined distance). The first dam DAM1 may be continuously located to continuously surround the display area DPA. In one or more embodiments, the first dam DAM1 may have a closed loop shape in plan view. The first dam DAM1 may be continuously located to reduce or prevent the likelihood of an organic material of the low refractive index layer LRL or the like, which extends from the display area DPA, overflowing to the outer portion of the substrate SUB.

The second dam DAM2 may be located to surround the display area DPA and the first dam DAM1. The second dam DAM2 may be located in the non-display area NDA while being further outwardly apart from the display area DPA than the first dam DAM1. The second dam DAM2 may be continuously located to continuously surround the display area DPA. In one or more embodiments, the second dam DAM2 may have a closed loop shape in plan view. Similarly to the first dam DAM1, the second dam DAM2 may further reduce or prevent the likelihood of the organic material overflowing to the outer portion of the substrate SUB.

The dam structure portion DAM described above may be formed in the same process as an organic material of the display area NDA. For example, the dam structure portion DAM may be formed in the same process as the upper bank layer UBN. The dam structure portion DAM may be made of an organic material, and may be directly located on the via layer VIA made of an organic material. However, the adhesion between the dam structure portion DAM and the via layer VIA is an adhesion between organic materials, and therefore the adhesive force therebetween may be relatively small compared to the adhesive force between inorganic materials. In this case, when a high-pressure cleaning step is performed during the manufacturing process of the display device 10, the dam structure portion DAM may be peeled off by high-pressure cleaning.

In one or more embodiments, to improve the adhesive force, the dam structure portion DAM may be formed to have a structure of a plurality of organic material layers and an inorganic material layer interposed therebetween. In the following description, the dam structure portion DAM will be described by focusing on the first dam DAM1 with reference to FIGS. 8 to 10.

The first dam DAM1 may include a lower dam layer LDA, an intermediate dam layer MDA, the second insulating layer PAS2, and an upper dam layer UDA that are located on the via layer VIA.

The lower dam layer LDA may be directly located on the via layer VIA. The lower dam layer LDA may include the same material as the bank patterns BP1 and BP2. The top surface of the lower dam layer LDA may have the same height as the height of the top surface of the bank patterns BP1 and BP2. In one or more embodiments, the lower dam layer LDA may be formed concurrently or substantially simultaneously with the bank patterns BP1 and BP2 in the same process.

The intermediate dam layer MDA may be directly located on the lower dam layer LDA. The intermediate dam layer MDA may overlap the lower dam layer LDA while contacting the top surface of the lower dam layer LDA. As shown in FIG. 9, the intermediate dam layer MDA may have a width W2 that is smaller than a width W1 of the lower dam layer LDA in the second direction DR2 to be directly located on the lower dam layer LDA. However, the present disclosure is not limited thereto, and the intermediate dam layer MDA may directly contact the via layer VIA while covering the lower dam layer LDA, and the width W2 of the intermediate dam layer MDA may be greater than the width W1 of the lower dam layer LDA. The intermediate dam layer MDA may include the same material as the bank layer BNL. The top surface of the intermediate dam layer MDA may have the same height as the height of the top surface of the bank layer BNL. In one or more embodiments, the intermediate dam layer MDA may be concurrently or substantially simultaneously formed with the bank layer BNL in the same process.

The second insulating layer PAS2 may be directly located on the intermediate dam layer MDA and the lower dam layer LDA. The second insulating layer PAS2 may be located to extend from the display area DPA to the non-display area NDA. The second insulating layer PAS2 may extend along the top surface of the via layer VIA, may cover the side surface of the lower dam layer LDA and the side surface and the top surface of the intermediate dam layer MDA, and may extend to the outside. That is, the second insulating layer PAS2 may cover the intermediate dam layer MDA and the lower dam layer LDA.

As described above with reference to FIGS. 2 to 4, the second insulating layer PAS2 may include an inorganic material. Because the intermediate dam layer MDA and the lower dam layer LDA may be made of an organic material, the adhesive force to the via layer VIA may be relatively small. In one or more embodiments, the adhesive force of the first dam DAM1 may be improved by covering the intermediate dam layer MDA and the lower dam layer LDA by the second insulating layer PAS2 containing an inorganic material.

In one or more other embodiments, the third insulating layer PAS3 may be further located on the second insulating layer PAS2, or the third insulating layer PAS3 and the fourth insulating layer PAS4 may be further located on the second insulating layer PAS2. The third insulating layer PAS3 and the fourth insulating layer PAS4 may be located to extend from the display area DPA to the non-display area NDA, and may cover the intermediate dam layer MDA and the lower dam layer LDA.

The upper dam layer UDA may be directly located on the second insulating layer PAS2. The upper dam layer UDA may be located on the second insulating layer PAS2 to cover the intermediate dam layer MDA and the lower dam layer LDA, and may overlap the intermediate dam layer MDA and the lower dam layer LDA. For example, the upper dam layer UDA may overlap the intermediate dam layer MDA and the lower dam layer LDA, such that the intermediate dam layer MDA and the lower dam layer LDA are completely covered by the upper dam layer UDA. A width W3 of the upper dam layer UDA may be greater than the width W2 of the intermediate dam layer MDA and the width W1 of the lower dam layer LDA. For example, the upper dam layer UDA may include a portion that overlaps the intermediate dam layer MDA and the lower dam layer LDA, and a portion that does not overlap them.

The upper dam layer UDA may be made of an organic material, and the second insulating layer PAS2 formed directly under the upper dam layer UDA may be made of an inorganic material. Because the adhesive force between an organic material and an inorganic material is greater than the adhesive force between organic materials, the upper dam layer UDA may be directly located on the second insulating layer PAS2 to improve the adhesive force. For example, if the upper dam layer UDA completely covers the intermediate dam layer MDA and the lower dam layer LDA, the surface area of the second insulating layer PAS2 formed on the intermediate dam layer MDA and the lower dam layer LDA may increase, thereby further increasing the adhesion area with the upper dam layer UDA. Accordingly, the upper dam layer UDA may further improve the adhesive force of the first dam DAM1.

Meanwhile, referring to FIG. 11, the intermediate dam layer MDA may be omitted from the first dam DAM1 of the dam structure portion DAM of the display device 10 according to one or more embodiments.

The first dam DAM1 may include the lower dam layer LDA, the second insulating layer PAS2 that covers the lower dam layer LDA, and the upper dam layer UDA located on the second insulating layer PAS2. The second insulating layer PAS2 may be formed to completely cover the lower dam layer LDA, and the upper dam layer UDA may be formed to completely cover the lower dam layer LDA.

Even if the intermediate dam layer MDA is omitted, the likelihood of the lower dam layer LDA peeling off may be reduced or prevented because it is covered by the second insulating layer PAS2. Further, it is possible to increase the adhesion area between the second insulating layer PAS2 and the upper dam layer UDA by a step of the lower dam layer LDA. Accordingly, the upper dam layer UDA may improve the adhesive force of the first dam DAM1.

Although the dam structure portion DAM has been described by exemplifying the first dam DAM1 of FIGS. 9 to 11, the present disclosure is not limited thereto, and the second dam DAM2 is also the same as described above.

Figure 12:
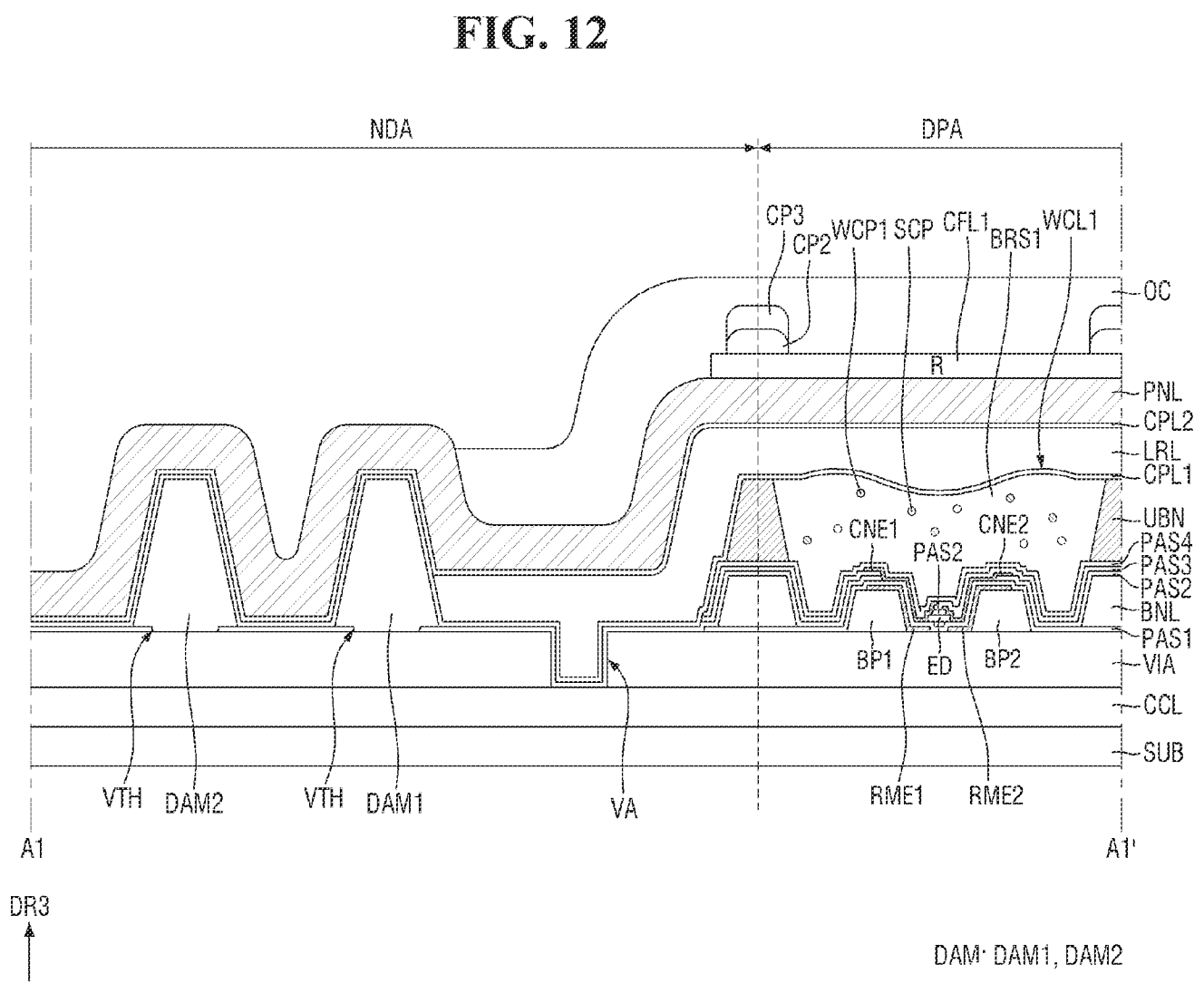
Figure 13:
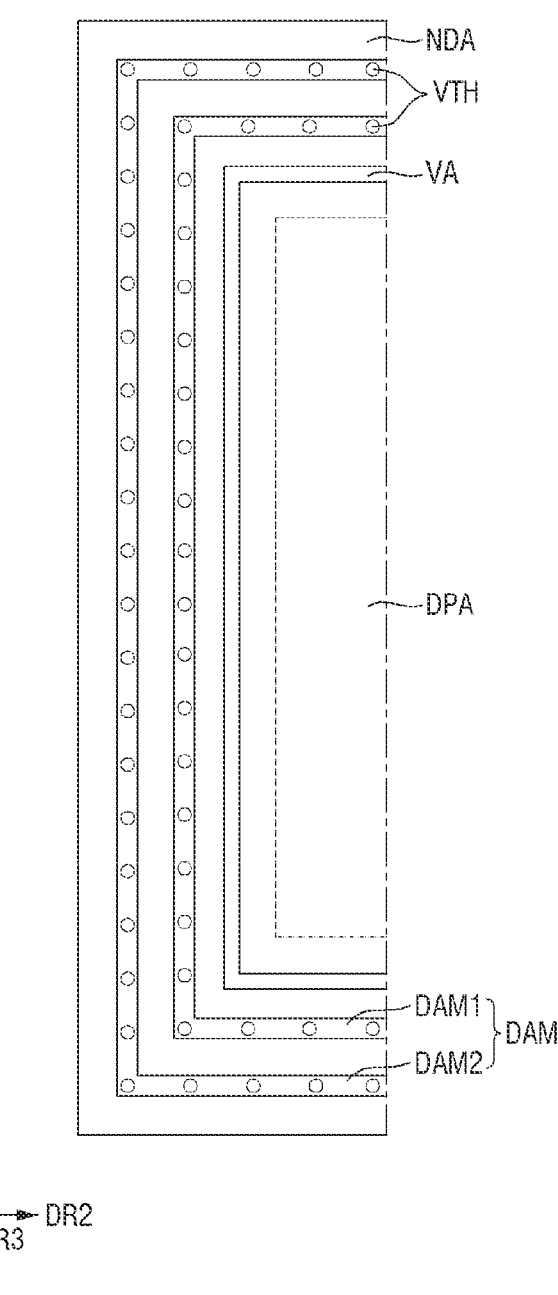
FIG. 13 is a plan view illustrating portions of a display area and a non-display area of a display device according to one or more other embodiments.
Figure 14:
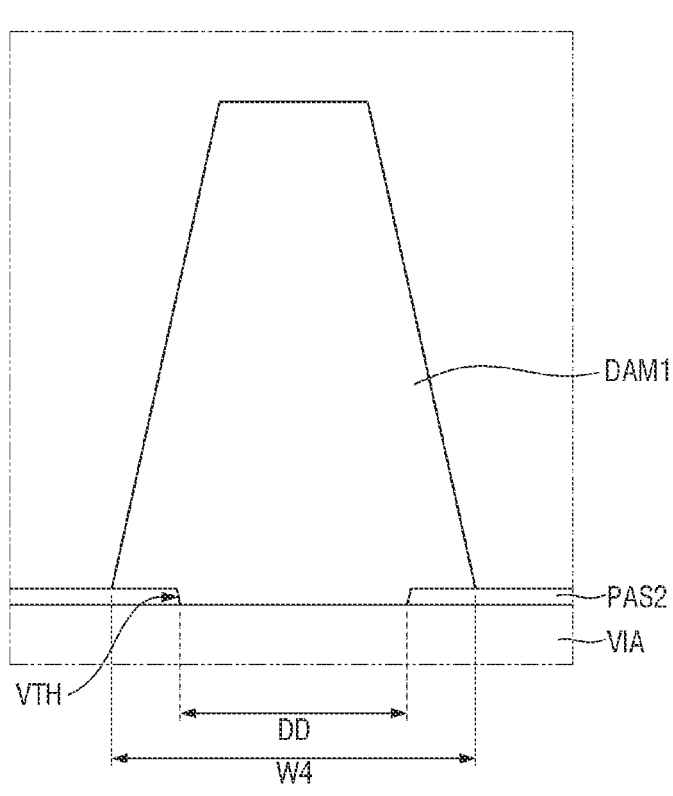
FIG. 14 is a cross-sectional view showing a dam structure according to one or more other embodiments.

FIG. 12 is a cross-sectional view schematically illustrating a display device according to one or more other embodiments. FIG. 13 is a plan view illustrating portions of a display area and a non-display area of a display device according to one or more other embodiments. FIG. 14 is a cross-sectional view showing a dam structure according to one or more other embodiments.

Referring to FIGS. 12 to 14, the corresponding embodiments are different from the embodiments corresponding to FIGS. 7 to 11 in that the dam structure portion DAM is formed of a single layer and overlaps a vent hole VTH formed in the second insulating layer PAS2. In the following description, redundant description of the above-described embodiments will be omitted while focusing on differences.

The second insulating layer PAS2 may include or define a plurality of vent holes VTH. The plurality of vent holes VTH may be located to surround the display area DPA and the hole portion VA. The plurality of vent holes VTH may be spaced apart from the hole portion VA to the outer portion of the substrate SUB to be located in the non-display area NDA. The plurality of vent holes VTH may have a diameter (e.g., predetermined diameter), and may pass through the second insulating layer PAS2. The plurality of vent holes VTH may serve as a passage through which gas generated in the via layer VIA in a subsequent heat treatment process can be discharged to the outside.

The plurality of vent holes VTH may be located to be spaced apart from each other, and may be formed, for example, in a plurality of island-like patterns. The plurality of vent holes VTH may be located to be spaced apart from each other at an interval (e.g., predetermined interval), but are not limited thereto. The vent holes VTH may be formed of a discontinuous line or a continuous line. The vent holes VTH are depicted as having a circular hole shape, and as being arranged in a dotted line surrounding the display area DPA. The plurality of vent holes VTH may be formed in at least one dotted line (e.g., imaginary line). For example, the plurality of vent holes VTH may be arranged to correspond to each of the first dam DAM1 and the second dam DAM2.

The dam structure portion DAM may include the first dam DAM1 and the second dam DAM2 that overlap the plurality of vent holes VTH to correspond thereto. Each of the first dam DAM1 and the second dam DAM2 may be formed of a single layer. However, the present disclosure is not limited thereto, and the first dam DAM1 and the second dam DAM2 may have a multilayer structure as in the above-described embodiments corresponding to FIGS. 8 to 11. The first dam DAM1 and the second dam DAM2 may be directly located on the via layer VIA and the second insulating layer PAS2. The first dam DAM1 and the second dam DAM2 may include the same material as the upper bank layer UBN in the display area DPA. The top surfaces of the first dam DAM1 and the second dam DAM2 may have the same height as the height of the top surface of the upper bank layer UBN. In one or more embodiments, the first dam DAM1 and the second dam DAM2 may be concurrently or substantially simultaneously formed with the upper bank layer UBN in the same process.

Each of the first dam DAM1 and the second dam DAM2 may overlap the plurality of vent holes VTH of the second insulating layer PAS2. The first dam DAM1 and the second dam DAM2 may be located to fill the plurality of vent holes VTH of the second insulating layer PAS2 to directly contact the top surface of the via layer VIA that is exposed in the plurality of vent holes VTH. The first dam DAM1 and the second dam DAM2 may directly contact the top surface and the side surface of the second insulating layer PAS2 in which the vent holes VTH are formed. As the dam structure portion DAM contacts the via layer VIA in the plurality of vent holes VTH, gas generated in the via layer VIA may be discharged to the outside through the dam structure portion DAM.

To improve the adhesive force of the dam structure portion DAM, a width W4 of each of the first dam DAM1 and the second dam DAM2 may be greater than a diameter DD of the vent hole VTH, as shown in FIG. 14. Because the first dam DAM1 and the second dam DAM2, which are made of an organic material, contact the via layer VIA in the region where the vent holes VTH are located, the adhesive force thereof may be decreased. If the width W4 of each of the first dam DAM1 and the second dam DAM2 is formed to be larger than the diameter DD of the vent hole VTH, the first dam DAM1 and the second dam DAM2 may contact not only the top surface of the via layer VIA, but also may contact the side surface and the top surface of the second insulating layer PAS2, thereby increasing the adhesive force.

In the above-described embodiments of FIGS. 7 to 14, the dam structure portion DAM has been illustrated and described as including two dams DAM1 and DAM2, but the present disclosure is not limited thereto. The dam structure portion DAM may include one dam, or three or more dams.

Figure 15:
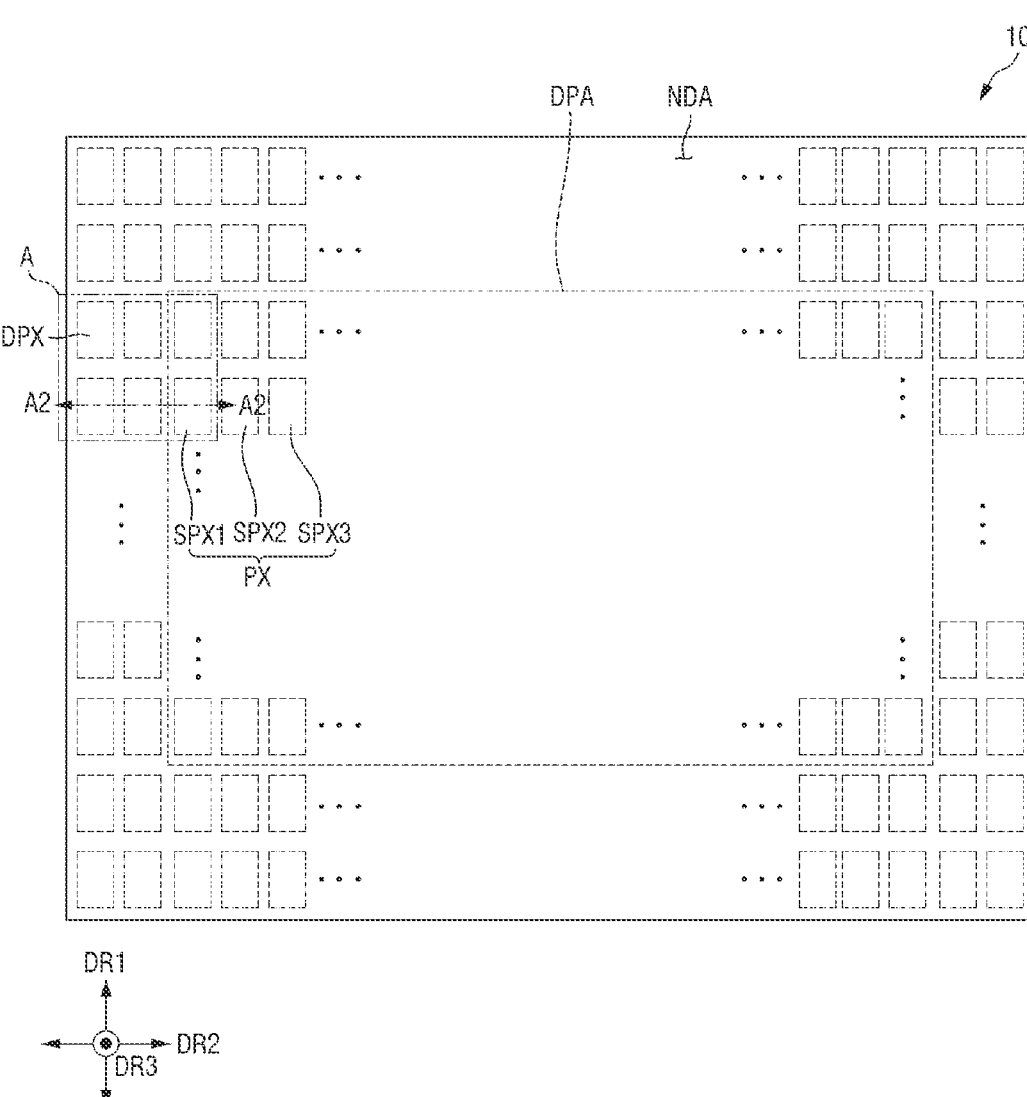
FIG. 15 is a plan view illustrating a display area and a non-display area of a display device according to still one or more other embodiments.
Figure 16:
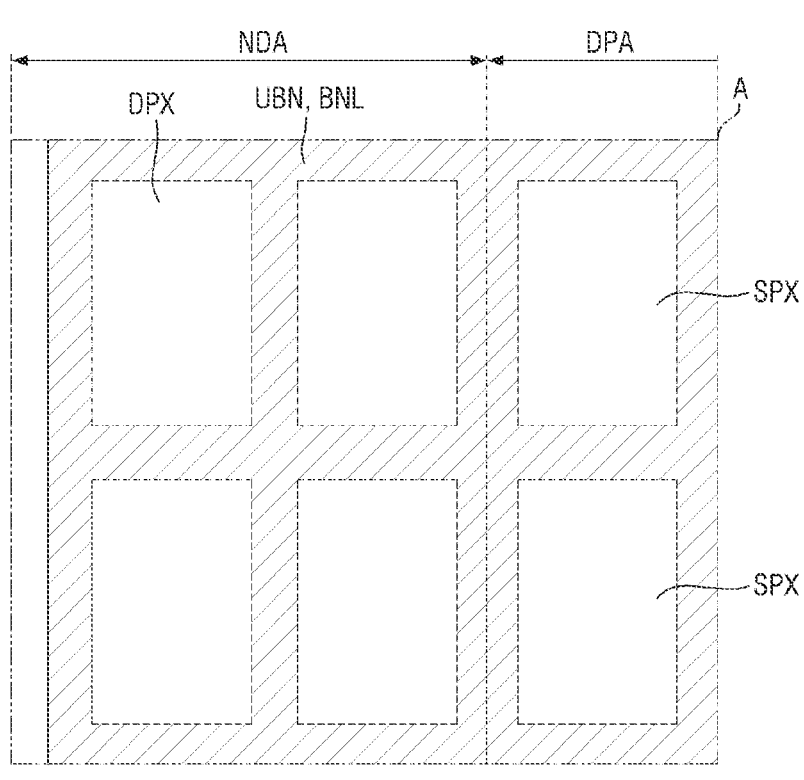
FIG. 16 is an enlarged plan view of area A of FIG. 15.
Figure 16:
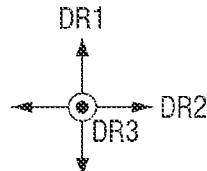
Figure 17:
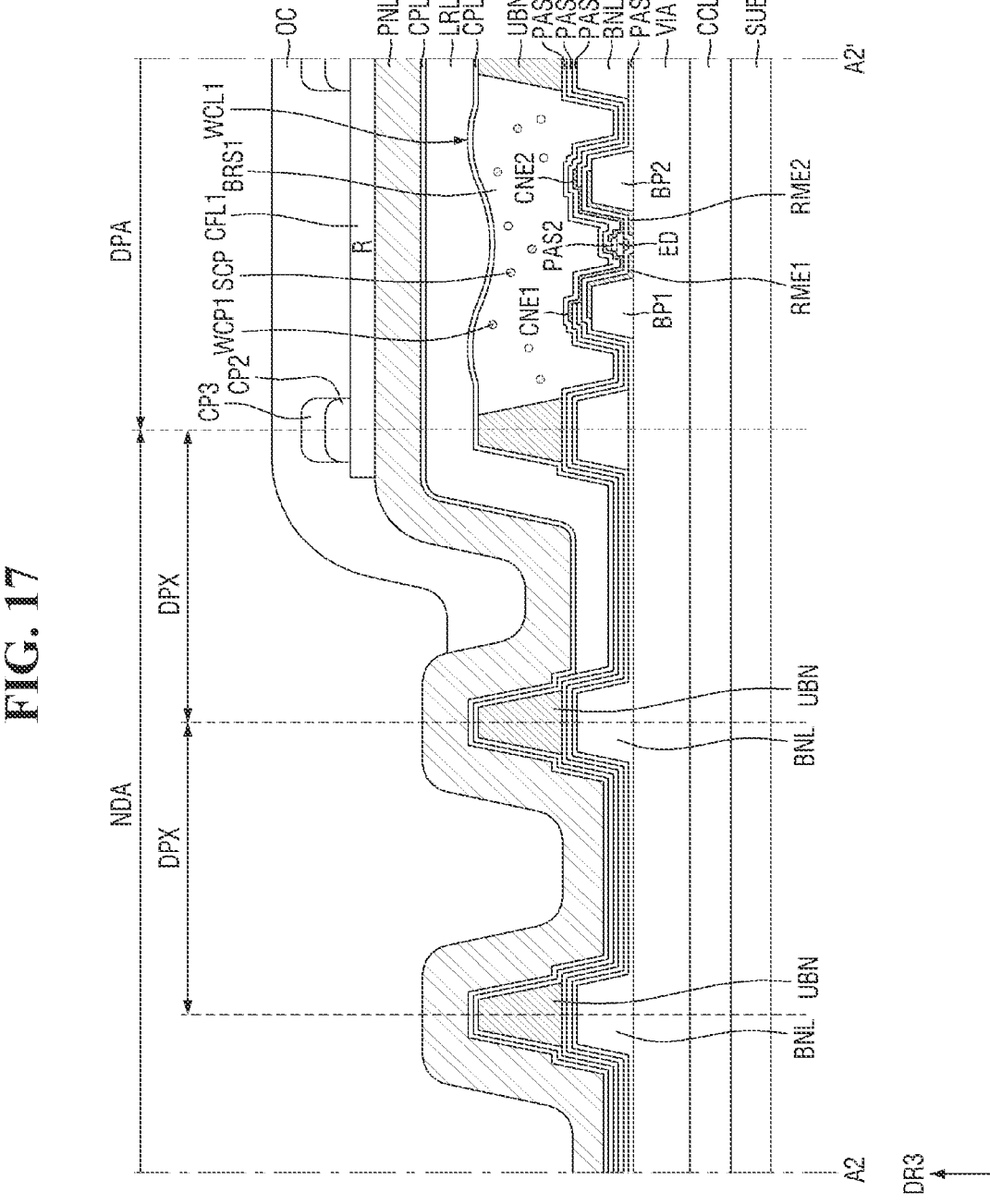
FIG. 17 is a cross-sectional view taken along the line A2-A2' in FIG. 15.

FIG. 15 is a plan view illustrating a display area and a non-display area of a display device according to still one or more other embodiments. FIG. 16 is an enlarged plan view of area A of FIG. 15. FIG. 17 is a cross-sectional view taken along the line A2-A2' in FIG. 15.

Referring to FIGS. 15 to 17, the corresponding embodiments are different from the above-described embodiments of FIGS. 7 to 14 in that the dam structure portion DAM and the hole portion VA are omitted from the non-display area NDA, and a plurality of dummy pixels DPX are located therein. In the following description, redundant description of the above-described embodiments will be omitted while focusing on differences.

The plurality of dummy pixels DPX may be located in the non-display area NDA to surround the display area DPA. The plurality of dummy pixels DPX may be arranged in a matrix fashion in the non-display area NDA. The shape of each dummy pixel DPX may be a rectangular or square shape in plan view. However, the present disclosure is not limited thereto, and it may be a rhombic shape in which each side is inclined with respect to one direction. The dummy pixels DPX may be arranged in a stripe type or an island type. The dummy pixel DPX is illustrated and described as having the same shape as that of the sub-pixels SPXn located in the display area DPA.

The plurality of dummy pixels DPX may be arranged in a plurality of columns at both side portions of the display area DPA in the second direction DR2, and may be arranged in a plurality of rows at both side portions of the display area DPA in the first direction DR1. For example, at each of the left and right sides of the display area DPA, the dummy pixels DPX may be arranged in two columns, and at each of the top and bottom sides of the display area DPA, the dummy pixels DPX may be arranged in two rows. However, the present disclosure is not limited thereto, and the dummy pixels DPX may be arranged in three or more columns and three or more rows.

The plurality of dummy pixels DPX may be delimited by the bank layer BNL and the upper bank layer UBN that extend from the display area DPA. The bank layer BNL may be located at a boundary between the sub-pixels SPXn that are adjacent in the first direction DR1 and the second direction DR2 in the display area DPA. Further the bank layer BNL may be located at a boundary between the dummy pixels DPX that are adjacent in the first direction DR1 and the second direction DR2 in the non-display area NDA. The bank layer BNL may include portions extending in the first direction DR1 and the second direction DR2 in plan view to be arranged in a grid pattern over the entire surfaces of the display area DPA and the non-display area NDA. The bank layer BNL may be located across the boundary between the dummy pixels DPX to delimit the neighboring dummy pixels DPX.

The bank layer BNL may be located on the first insulating layer PAS1. The first insulating layer PAS1 may continuously extend from the display area DPA to the non-display area NDA, and may be located on the via layer VIA. The bank layer BNL may be directly located on the first insulating layer PAS1, and may surround each of the dummy pixels DPX.

The bank patterns BP1 and BP2, the light emitting element ED, and the connection electrodes CNE1 and CNE2 may be omitted from each of the dummy pixels DPX delimited by the bank layer BNL. Each dummy pixel DPX is for monitoring an organic material and an inorganic material formed in the sub-pixels SPXn of the display area DPA, and does not emit light.

The second insulating layer PAS2, the third insulating layer PAS3, and the fourth insulating layer PAS4 may be located on the bank layer BNL and the first insulating layer PAS1 of the non-display area NDA. Each of the second insulating layer PAS2, the third insulating layer PAS3, and the fourth insulating layer PAS4 may be located to extend from the display area DPA to the non-display area NDA. Each of the second insulating layer PAS2, the third insulating layer PAS3, and the fourth insulating layer PAS4 may cover the bank layer BNL and the first insulating layer PAS1, and may extend to the outer portion of the substrate SUB over the bank layer BNL.

The upper bank layer UBN, which delimits the dummy pixels DPX, may be located on the fourth insulating layer PAS4 of the non-display area NDA. The upper bank layer UBN may be located on the fourth insulating layer PAS4 to overlap the bank layer BNL. The upper bank layer UBN may extend from the display area DPA, and may be located in a grid pattern including portions extending in the first direction DR1 and the second direction DR2. The upper bank layer UBN is located on the fourth insulating layer PAS4 that is an inorganic material, and thus has an excellent adhesive force to the fourth insulating layer PAS4, thereby reducing or preventing the likelihood of it peeling off in a high-pressure cleaning process.

The bank layer BNL and the upper bank layer UBN, which overlap each other in the non-display area NDA, may serve as a dam structure. As described above, when the organic material sprayed on the display area DPA overflows to the non-display area NDA, the bank layer BNL and the upper bank layer UBN, which are located in a grid shape having a relatively great thickness, may serve as a dam structure. Accordingly, it is possible to reduce or prevent the likelihood of the organic material overflowing to the outside of the substrate SUB beyond the non-display area NDA.

The color control layer WCL may be omitted from a space delimited by the bank layer BNL and the upper bank layer UBN in each of the dummy pixels DPX. Because each dummy pixel DPX does not emit light, the color control layer WCL is unnecessary (e.g., in the non-display area NDA). Accordingly, each dummy pixel DPX may serve as a grid-shaped dam structure to trap the organic material, thereby further reducing or preventing the likelihood of the organic material overflowing to the outside.

The first capping layer CPL1 and the second capping layer CPL2 may be located on the upper bank layer UBN of the non-display area NDA. The first capping layer CPL1 and the second capping layer CPL2 may extend to the non-display area NDA to be located up to the outer portion of the substrate SUB over the upper bank layer UBN. Further, the low refractive index layer LRL may be located to extend from the display area DPA to the non-display area NDA. The low refractive index layer LRL may be filled in the space of the dummy pixels DPX adjacent to the display area DPA, and the likelihood of the low refractive index layer LRL overflowing to the outside of the substrate SUB by the upper bank layer UBN may be reduced or prevented.

The planarization layer PNL may extend from the display area DPA to be located on the second capping layer CPL2 of the non-display area NDA. In the non-display area NDA, the planarization layer PNL may be located up to the outer part thereof over the upper bank layer UBN. The overcoat layer OC may be located to cover the planarization layer PNL in the non-display area NDA. The overcoat layer OC may have a shape in which the height of the top surface gradually decreases as going from the display area DPA to the outermost portion of the non-display area NDA.

Hereinafter, a method of manufacturing the above-described display device will be described with reference to other drawings.

FIGS. 18 to 23 are views sequentially illustrating a method of manufacturing a display device according to one or more embodiments. The method of manufacturing the display device 10 shown in FIGS. 18 to 23 may correspond to the display device 10 of FIG. 8 described above.

Figure 18:
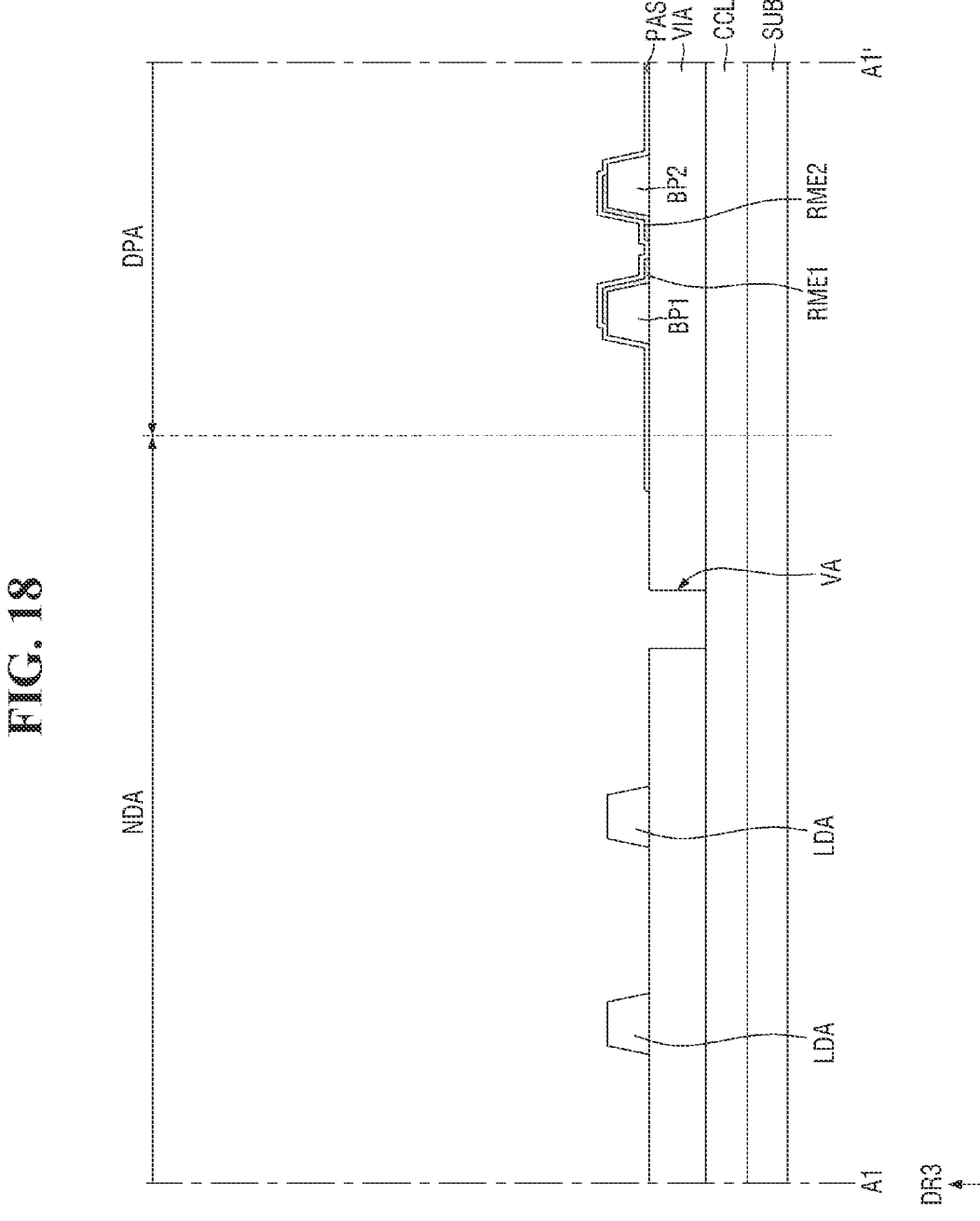

First, referring to FIG. 18, the substrate SUB is prepared, and the circuit layer CCL is formed on the substrate SUB. The circuit layer CCL may be formed by stacking first to third conductive layers and inorganic material layers. For example, the first to third conductive layers may be formed by depositing a metal material and patterning the metal material using a mask. The structure of the circuit layer CCL located on the substrate SUB is the same as that described above, and thus a detailed description thereof will be omitted.

Next, an organic material is coated on the circuit layer CCL and patterned through a photolithography process to form the via layer VIA including/defining the hole portion VA. The via layer VIA may be formed on the entire surface of the substrate SUB across the display area DPA and the non-display area NDA. The hole portion VA is formed in the non-display area NDA adjacent to the display area DPA to surround the display area DPA. The hole portion VA may expose a portion of the circuit layer CCL, for example, the first passivation layer (PV1 in FIG. 3) under the via layer VIA.

Subsequently, the bank patterns BP 1 and BP2, the lower dam layers LDA, the electrodes RME1 and RME2, and the first insulating layer PAS1 are formed on the via layer VIA. The bank patterns BP1 and BP2 and the lower dam layer LDA are concurrently or substantially simultaneously formed by coating an organic material on the via layer VIA and patterning the organic material through a photolithography process. The lower dam layers LDA may be located to be spaced apart from each other, and may be formed to surround the hole portion VA and the display area DPA. The electrodes RME1 and RME2 may be formed by depositing a metal material on the via layer VIA and the bank patterns BP1 and BP2, and by patterning the metal material using a mask. The first insulating layer PAS1 may be formed across the display area DPA and the non-display area NDA by depositing an inorganic material.

Figure 19:
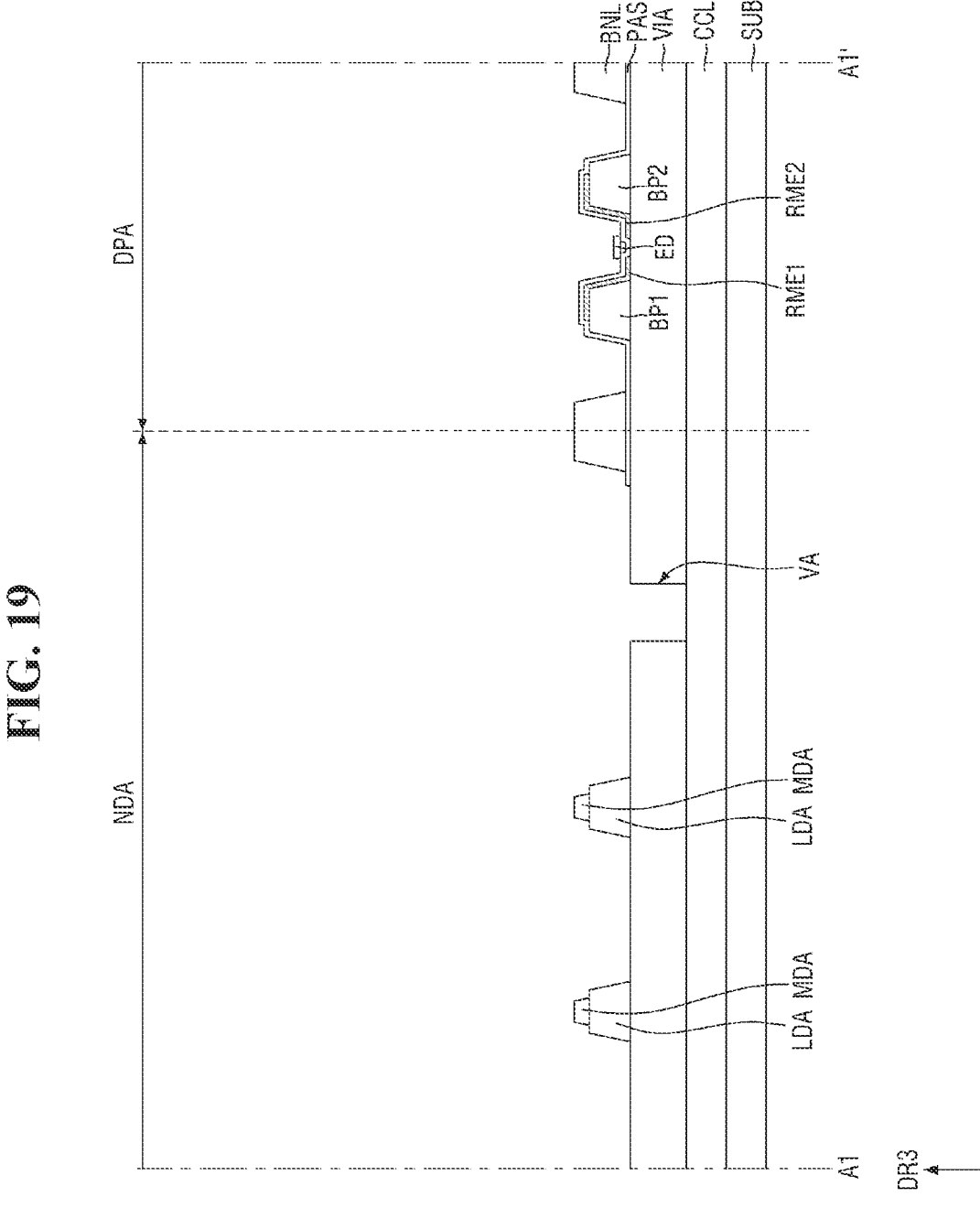

Next, referring to FIG. 19, the bank layer BNL and the intermediate dam layer MDA are formed on the substrate SUB. The bank layer BNL and the intermediate dam layer MDA are concurrently or substantially simultaneously formed by coating an organic material on the substrate SUB, and by patterning the organic material through a photolithography process. The bank layer BNL is formed on the first insulating layer PAS1 of the display area DPA. The intermediate dam layers MDA are formed on the lower dam layers LDA of the non-display area NDA to respectively correspond thereto. The intermediate dam layers MDA may be directly formed on the top surfaces of the lower dam layers LDA.

Figure 20:
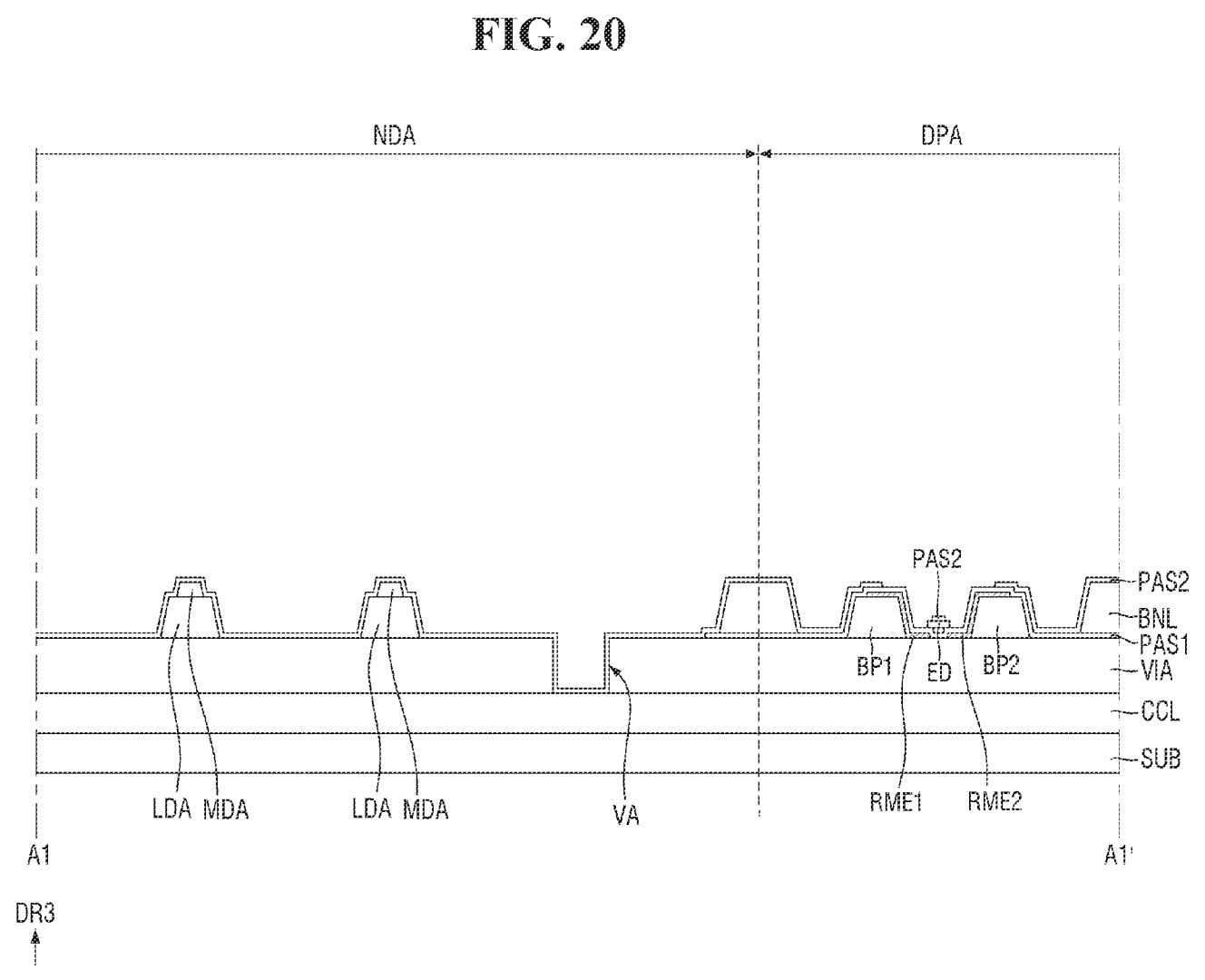

Thereafter, referring to FIG. 20, a plurality of light emitting elements ED are formed between the bank patterns BP1 and BP2 of the display area DPA. The light emitting elements ED may be located on the electrodes RME1 and RME2 through an inkjet printing process. If ink, in which the light emitting elements ED are dispersed, is sprayed into a region surrounded by the bank layer BNL, and then an electric signal is applied to the electrodes RME1 and RME2, the light emitting elements ED in the ink may be seated on the electrodes RME1 and RME2 while changing their positions and orientations. The light emitting elements ED may be aligned by an electric field generated by an electric signal applied to the electrodes RME1 and RME2 between the bank layers BNL. The light emitting element ED may be located such that the first end thereof is placed on the first electrode RME1 and the second end thereof is placed on the second electrode RME2.

Thereafter, the second insulating layer PAS2 is formed. The second insulating layer PAS2 is formed by depositing an inorganic material on the substrate SUB, and by patterning the inorganic material using a mask. The second insulating layer PAS2 is formed to extend from the display area DPA to the non-display area NDA. The second insulating layer PAS2 is continuously formed in the hole portion VA to cover the lower dam layers LDA and the intermediate dam layers MDA.

Figure 21:
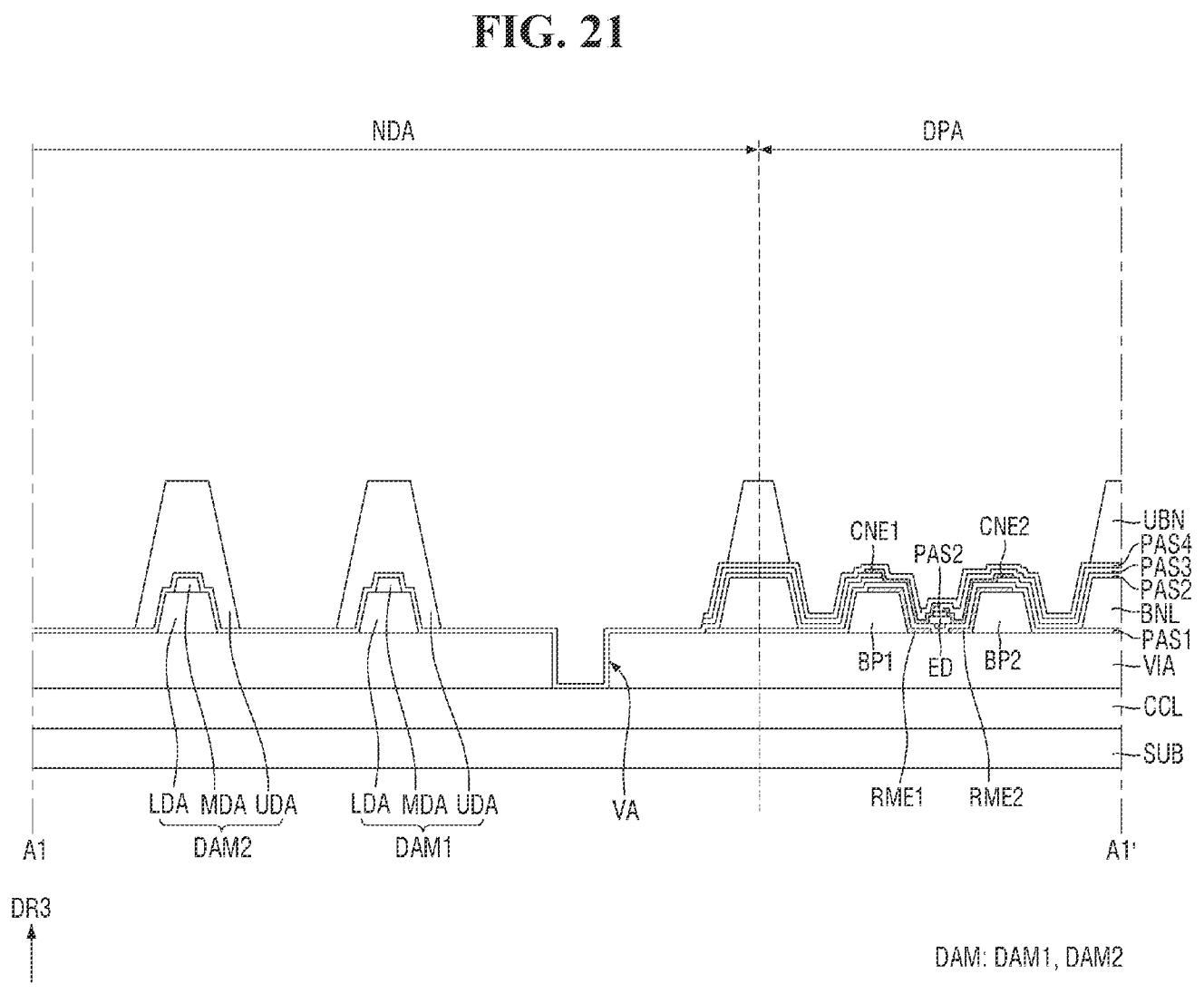

Next, referring to FIG. 21, the connection electrodes CNE1 and CNE2, the third insulating layer PAS3, and the fourth insulating layer PAS4 are formed in the display area DPA. The connection electrodes CNE1 and CNE2 may be formed by depositing a metal material on the light emitting elements ED and the second insulating layer PAS2, and by patterning the metal material using a mask. The third insulating layer PAS3 and the fourth insulating layer PAS4 may be formed by depositing an inorganic material.

Then, the upper bank layer UBN and the upper dam layer UDA are formed. The upper bank layer UBN and the upper dam layer UDA are concurrently or substantially simultaneously formed by coating an organic material on the substrate SUB, and by patterning the organic material through a photolithography process. The upper bank layer UBN is formed on the fourth insulating layer PAS4 of the display area DPA. The upper dam layers UDA are formed on the intermediate dam layers MDA of the non-display area NDA to respectively correspond thereto. The upper dam layers UDA may be formed to completely cover the intermediate dam layers MDA and the lower dam layers LDA. Accordingly, the dam structure DAM including the first dam DAM1 and the second dam DAM2, in which the lower dam layer LDA, the intermediate dam layer MDA, and the upper dam layer UDA are respectively stacked, is formed.

Figure 22:
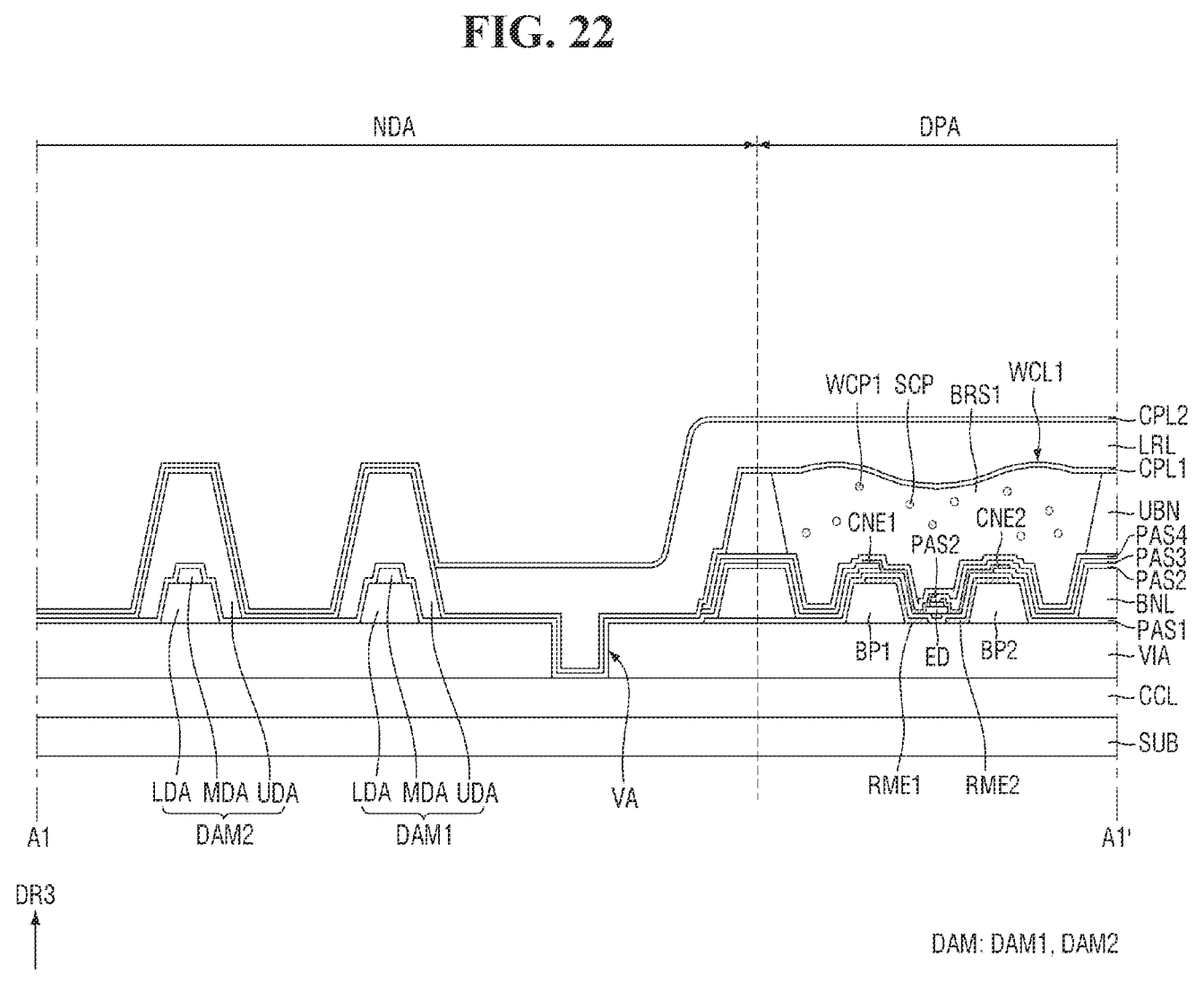

Next, referring to FIG. 22, the color control layer WCL, the first capping layer CPL1, the low refractive index layer LRL, and the second capping layer CPL2 are formed. The color control layer WCL is formed by spraying ink, in which the first wavelength conversion material WCP1 and the scatterer SCP are dispersed in the first base resin BRS1, into a region surrounded by the upper bank layer UBN. The first capping layer CPL1 and the second capping layer CPL2 are formed by depositing an inorganic material, and the low refractive index layer LRL is formed by coating an organic material. The first capping layer CPL1 and the second capping layer CPL2 may be formed to extend from the display area DPA to the non-display area NDA, and may cover the dam structure DAM. The low refractive index layer LRL may extend from the display area DPA to the non-display area NDA. The low refractive index layer LRL may fill the inside of the hole portion VA, and may be blocked by the first dam DAM1.

Figure 23:
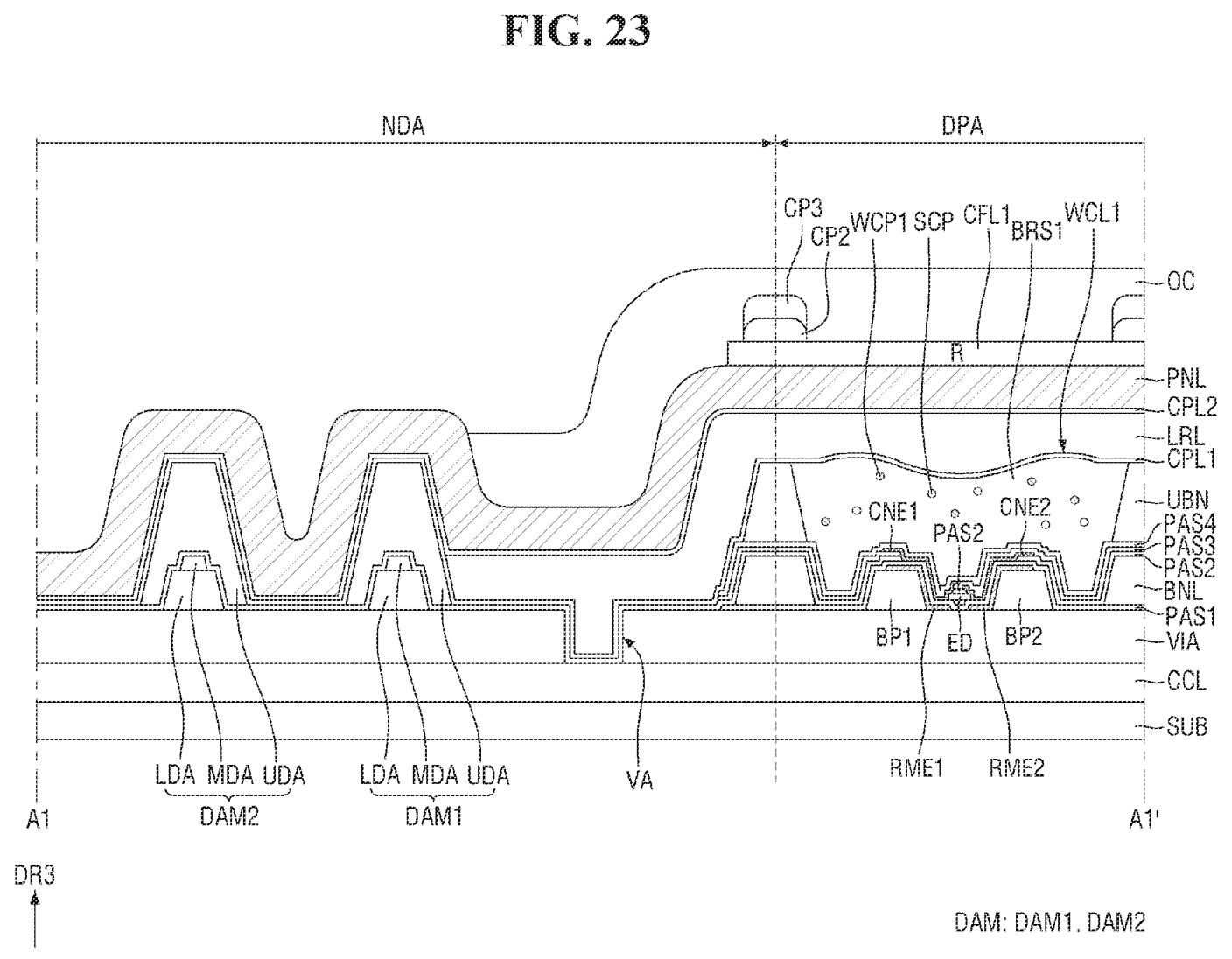

Thereafter, referring to FIG. 23, the planarization layer PNL, the color filter layer CFL, the color patterns CP1, CP2, and CP3, and the overcoat layer OC are formed. The planarization layer PNL is formed by coating an organic material. The planarization layer PNL may be formed to extend from the display area DPA to the non-display area NDA, and may cover the dam structure DAM. The color filter layer CFL may be formed by patterning the color filters CF1, CF2, and CF3 through a photolithography process. The color patterns CP1, CP2, and CP3 may also be formed on the color filters CF1, CF2, and CF3 through a photolithography process. The overcoat layer OC is formed by coating an organic material. Accordingly, the display device 10 according to one or more embodiments is manufactured.

As described above, in the method of manufacturing the display device 10 according to one or more embodiments, the dams DAM1 and DAM2 including the lower dam layer LDA, the intermediate dam layer MDA, and the upper dam layer UDA are respectively formed concurrently or substantially simultaneously with each of the bank patterns BP1 and BP2, the bank layer BNL, and the upper bank layer UBN in the same step, and thus there is an advantage in that a separate step for forming the dam structure DAM is unnecessary in the manufacturing process.

In concluding the detailed description, those skilled in the art will appreciate that many variations and modifications can be made to the disclosed embodiments without substantially departing from the aspects of the present disclosure. Therefore, the disclosed embodiments are used in a generic and descriptive sense only and not for purposes of limitation.

What is claimed is:

1. A display device comprising:
a substrate comprising a display area and a non-display area;
an insulating layer above the substrate, and in the display area and the non-display area; and
at least one dam in the non-display area, surrounding the display area, and comprising:
a lower dam layer above the substrate;
an intermediate dam layer above the lower dam layer; and
an upper dam layer covering the lower dam layer and the intermediate dam layer,
wherein the insulating layer is between the intermediate dam layer and the upper dam layer, and
wherein the insulating layer covers the lower dam layer and the intermediate dam layer, and contacts the lower dam layer and the intermediate dam layer.

2. The display device of claim 1, wherein the upper dam layer contacts a top surface of the insulating layer.

3. The display device of claim 1, wherein the intermediate dam layer contacts a top surface of the lower dam layer, and wherein a width of the lower dam layer is greater than a width of the intermediate dam layer.

4. The display device of claim 1, wherein a width of the upper dam layer is greater than a width of the lower dam layer and is greater than a width of the intermediate dam layer.

5. The display device of claim 1, further comprising a via layer between the substrate and the insulating layer, and defining a hole portion.

6. The display device of claim 5, wherein the hole portion is between the at least one dam and the display area, and surrounds the display area in plan view.

7. The display device of claim 5, wherein the insulating layer is above the via layer, and wherein a portion of the insulating layer is in the hole portion.

8. The display device of claim 1, wherein the display area comprises pixels comprising sub-pixels, the sub-pixels comprising:
   a first bank pattern and a second bank pattern spaced apart from each other;
   a first electrode overlapping the first bank pattern;
   a second electrode overlapping the second bank pattern;
   a light emitting element above the first electrode and the second electrode;
   a first connection electrode contacting one end of the light emitting element;
   a second connection electrode contacting another end of the light emitting element;
   a bank layer partitioning the sub-pixels; and
   an upper bank layer above the bank layer.

9. The display device of claim 8, wherein the lower dam layer comprises a same material as the first bank pattern and the second bank pattern,
   wherein the intermediate dam layer comprises a same material as the bank layer, and
   wherein the upper dam layer comprises a same material as the upper bank layer.

10. The display device of claim 8, wherein the insulating layer covers the first electrode, the second electrode, the first bank pattern, the second bank pattern, and the bank layer, and extends to the non-display area.

11. A display device comprising:
   a substrate comprising a display area and a non-display area;
   a via layer above the substrate and including an organic material;
   an insulating layer above the via layer, and in the display area and the non-display area; and
   at least one dam in the non-display area, and surrounding the display area,
   wherein the insulating layer defines vent holes penetrating the insulating layer in the non-display area, overlapping the at least one dam, exposing the via layer, and spaced apart along a perimeter of the display area.

12. The display device of claim 11, wherein the vent holes are spaced apart from each other to surround the display area, and expose a top surface of the via layer.

13. The display device of claim 12, wherein the at least one dam covers the vent holes, and
   wherein a width of the at least one dam is greater than a diameter of one of the vent holes.

14. The display device of claim 12, wherein the at least one dam contacts a top surface and a side surface of the insulating layer in which the vent holes are formed, and contacts the top surface of the via layer exposed by the vent holes.

15. An electronic device comprising:
   a substrate comprising a display area comprising sub-pixels, and a non-display area comprising dummy pixels;
   a bank layer above the substrate, and configured to partition the sub-pixels and the dummy pixels;
   an upper bank layer above the bank layer, and overlapping the bank layer; and
   at least two insulating layers between the bank layer and the upper bank layer, covering the bank layer, and continuously extending from the display area to the non-display area,
   wherein the dummy pixels surround the display area,
   wherein the bank layer is in a grid pattern, in plan view, and
   wherein the upper bank layer is in a grid pattern in plan view.

16. The electronic device of claim 15, wherein the bank layer and the upper bank layer continuously extend from the display area to the non-display area.

17. The electronic device of claim 15, further comprising:
   a color control layer above the sub-pixels;
   a first capping layer above the color control layer;
   a low refractive index layer above the first capping layer;
   a second capping layer above the low refractive index layer; and
   a planarization layer above the second capping layer,
   wherein the first capping layer, the low refractive index layer, the second capping layer, and the planarization layer extend from the display area to the non-display area above the dummy pixels.

18. The electronic device of claim 17, wherein the first capping layer, the second capping layer, and the planarization layer cover the bank layer and the upper bank layer in the non-display area.

* * * * *